(12) United States Patent
Yamashita

(10) Patent No.: US 11,610,931 B2
(45) Date of Patent: Mar. 21, 2023

(54) IMAGING APPARATUS

(71) Applicant: Sony Semiconductor Solutions Corporation, Kanagawa (JP)

(72) Inventor: Hirofumi Yamashita, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 17/674,432

(22) Filed: Feb. 17, 2022

(65) Prior Publication Data

US 2022/0231072 A1 Jul. 21, 2022

Related U.S. Application Data

(63) Continuation of application No. 16/636,147, filed as application No. PCT/JP2018/024329 on Jun. 27, 2018, now Pat. No. 11,289,528.

(30) Foreign Application Priority Data

Aug. 10, 2017 (JP) .............................. JP2017-155855

(51) Int. Cl.
*H01L 27/14* (2006.01)
*H01L 27/146* (2006.01)
(Continued)

(52) U.S. Cl.
CPC .. *H01L 27/14641* (2013.01); *H01L 27/14612* (2013.01); *H01L 27/14634* (2013.01);
(Continued)

(58) Field of Classification Search
CPC .. H04N 5/357; H04N 5/379; H01L 27/14612; H01L 27/14634; H01L 27/14636;
(Continued)

(56) References Cited

U.S. PATENT DOCUMENTS 10,728,475 B2 7/2020 Yanagita et al.
2008/0062296 A1 3/2008 Ogura et al.
(Continued)

FOREIGN PATENT DOCUMENTS

CN 102081481 A 6/2011
CN 105376467 A 3/2016
(Continued)

OTHER PUBLICATIONS

Chinese Office Action dated Dec. 2, 2021 for corresponding Chinese Application No. 201880047158.0.

*Primary Examiner* — Tony Ko
(74) *Attorney, Agent, or Firm* — Michael Best & Friedrich LLP

(57) ABSTRACT

Provided is an imaging apparatus including an imaging unit having a plurality of pixels, the pixels each having: a conversion element converting incident light into photoelectrons; a floating diffusion layer electrically connected to the conversion element and converting the photoelectrons into a voltage signal; a differential amplifier circuit electrically connected to the floating diffusion layer, including an amplifier transistor to which a potential of the floating diffusion layer is input, and amplifying the potential of the floating diffusion layer; a feedback transistor electrically connected to the amplifier transistor and initializing the differential amplifier circuit; a clamp capacitance connected in series between the floating diffusion layer and the amplifier transistor; and a reset transistor connected in parallel between the floating diffusion layer and the clamp capacitance and initializing the potential of the floating diffusion layer.

10 Claims, 26 Drawing Sheets

(51) Int. Cl.
*H04N 5/369* (2011.01)
*H04N 5/357* (2011.01)
*H03F 3/45* (2006.01)

(52) U.S. Cl.
CPC .. *H01L 27/14636* (2013.01); *H01L 27/14643* (2013.01); *H04N 5/357* (2013.01); *H04N 5/379* (2018.08); *H03F 3/4521* (2013.01)

(58) Field of Classification Search
CPC ......... H01L 27/14641; H01L 27/14643; H03F 3/4521; H03F 3/45183
See application file for complete search history.

(56) References Cited

U.S. PATENT DOCUMENTS

2012/0147237 A1    6/2012    Xu et al.
2015/0229859 A1*   8/2015    Guidash ................. H04N 5/378
                                                           348/308

FOREIGN PATENT DOCUMENTS

| JP | 2016-92661 A | 5/2016 |
|----|----|----|
| WO | 2015019836 A1 | 2/2015 |
| WO | 2016009832 A1 | 1/2016 |
| WO | 2016199588 A1 | 12/2016 |

\* cited by examiner

FIG.7A
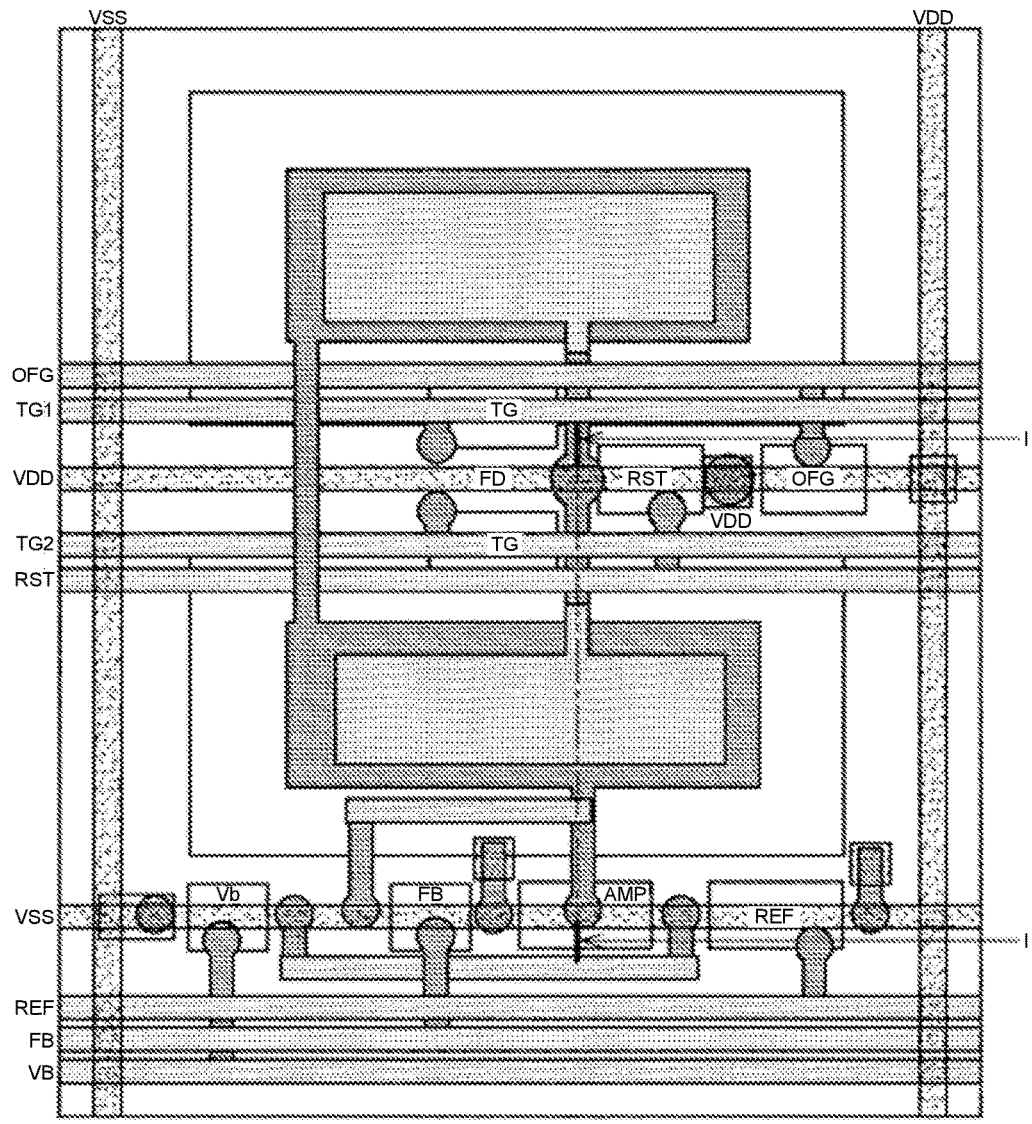
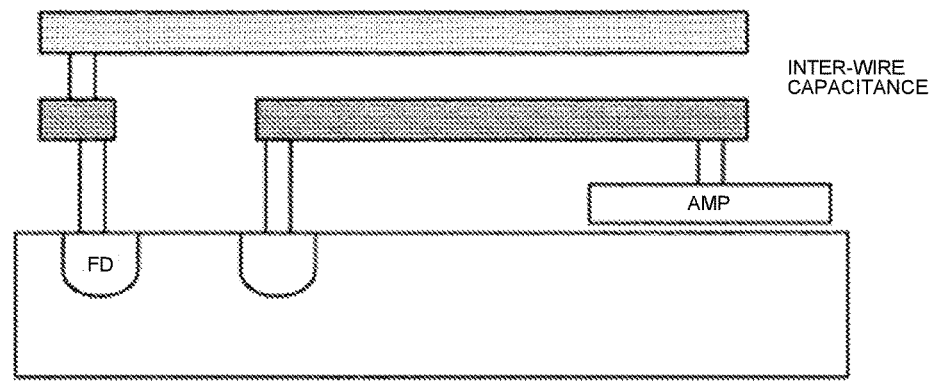

FIG.7B
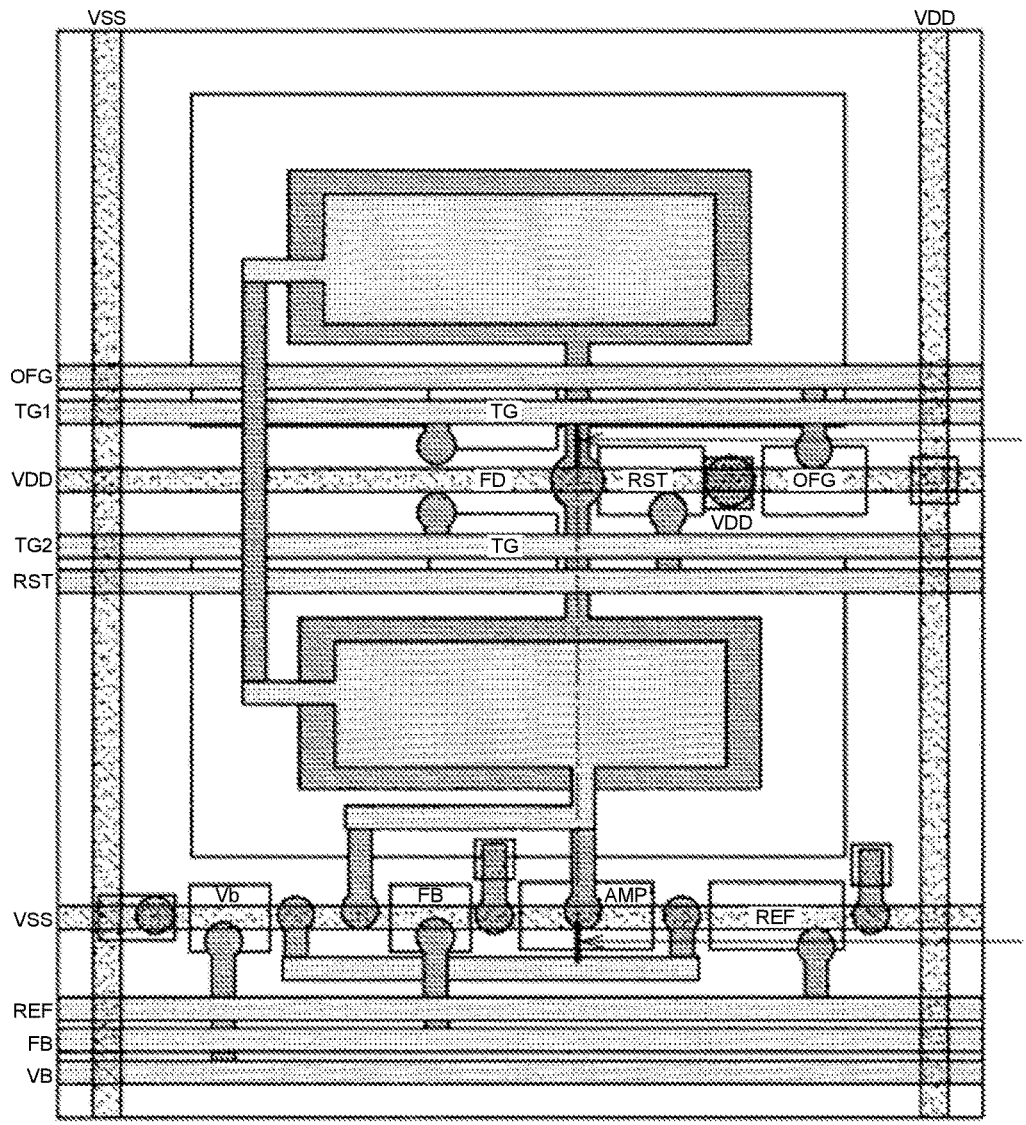
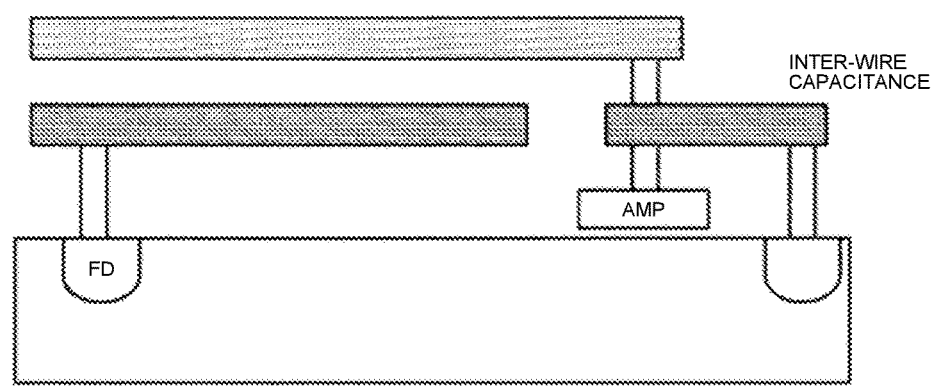

FIG.7C
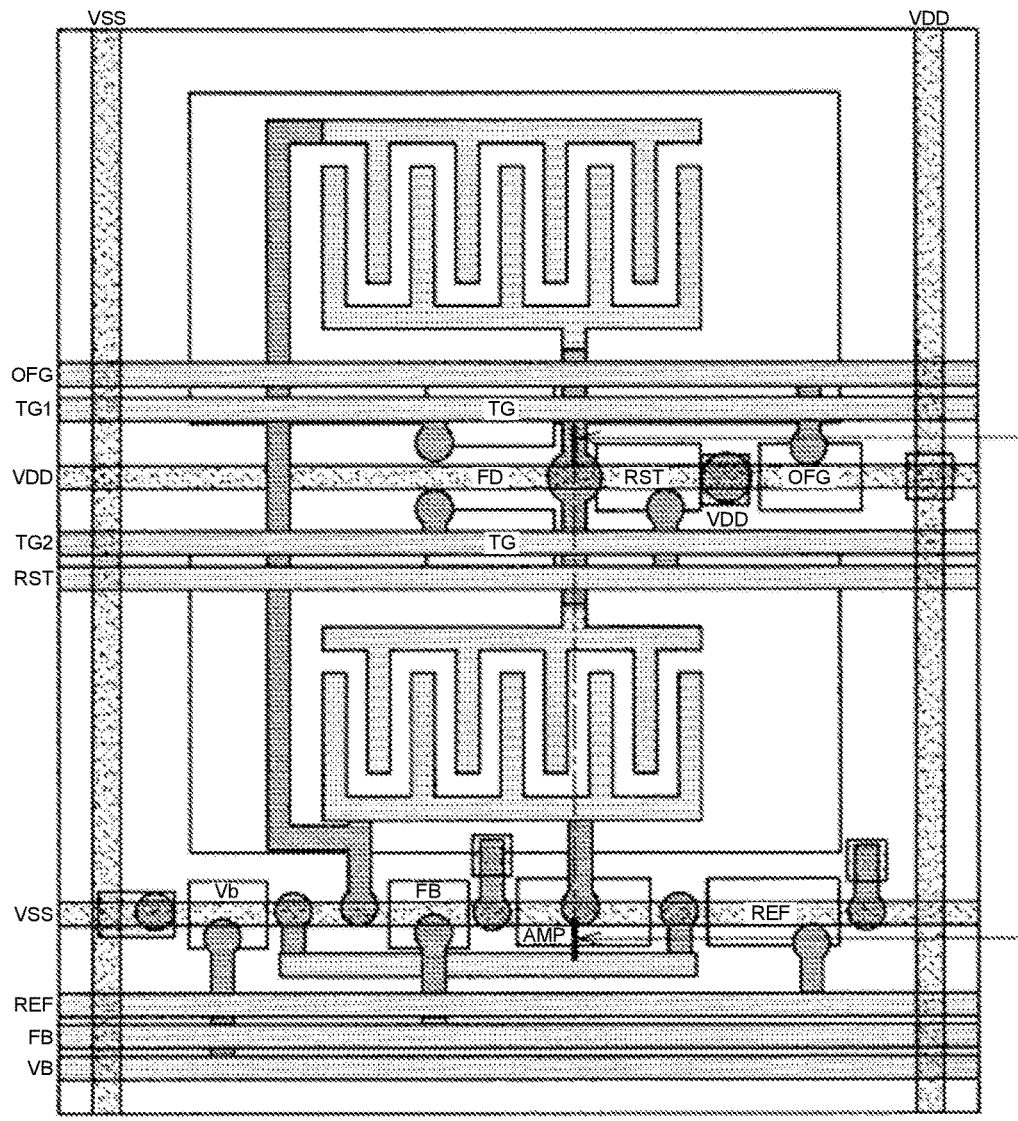
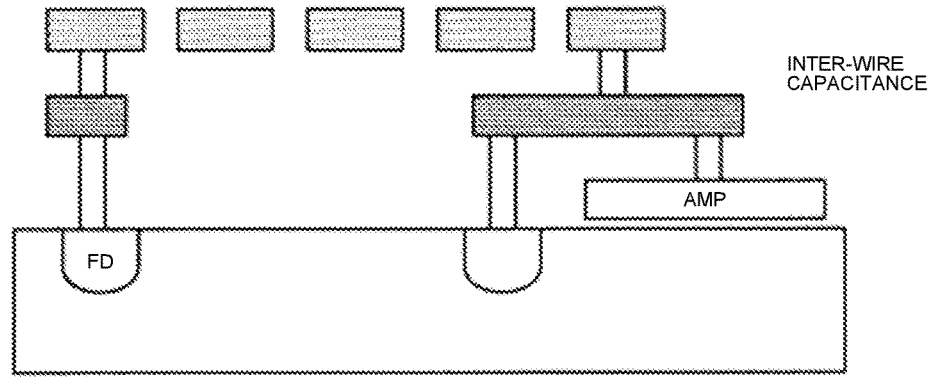

FIG.7D
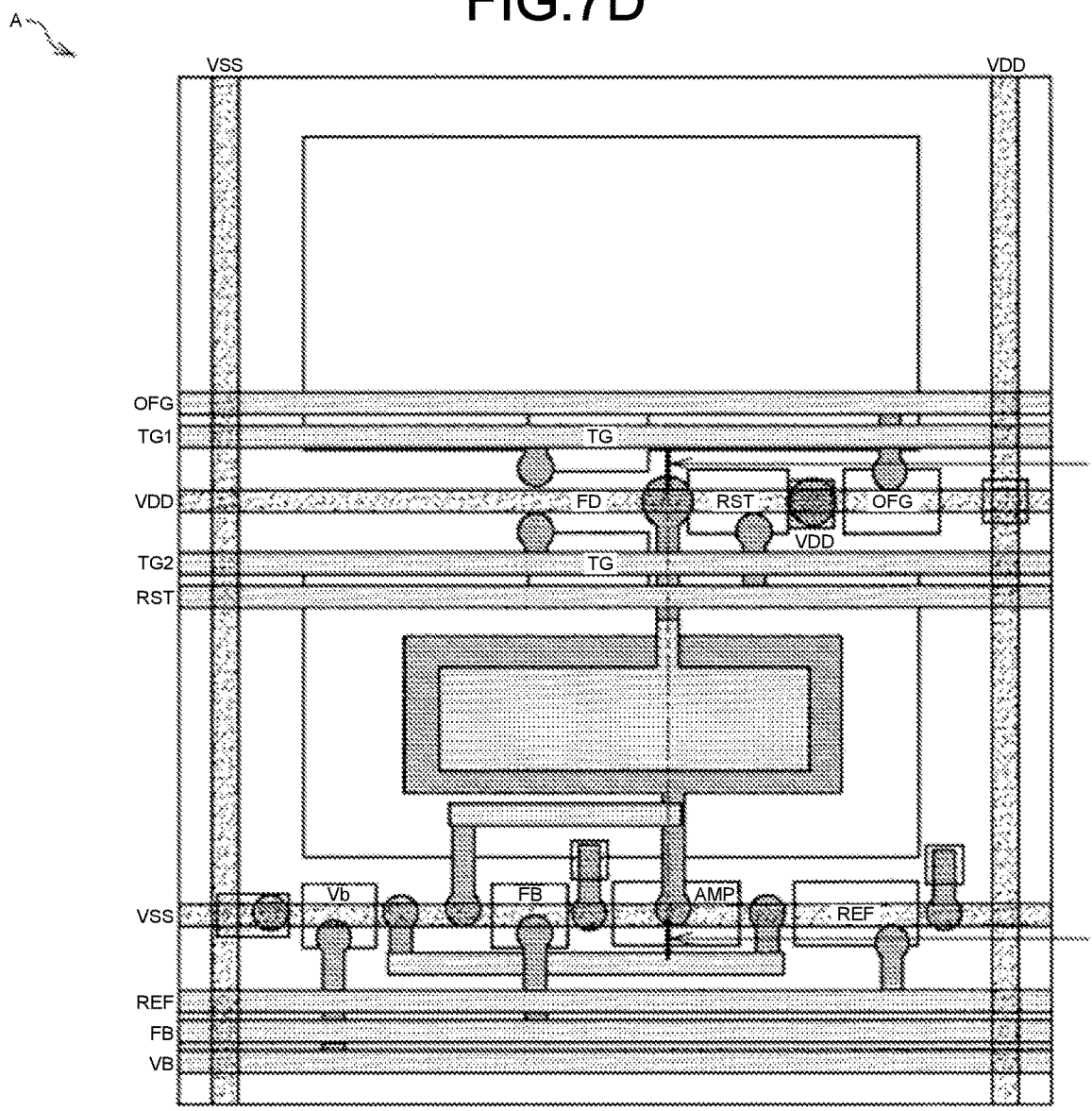
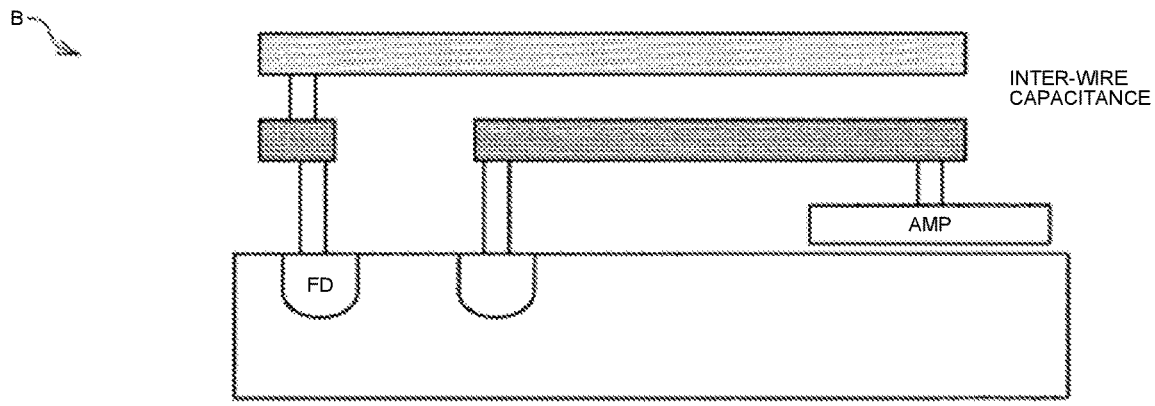

FIG.7E
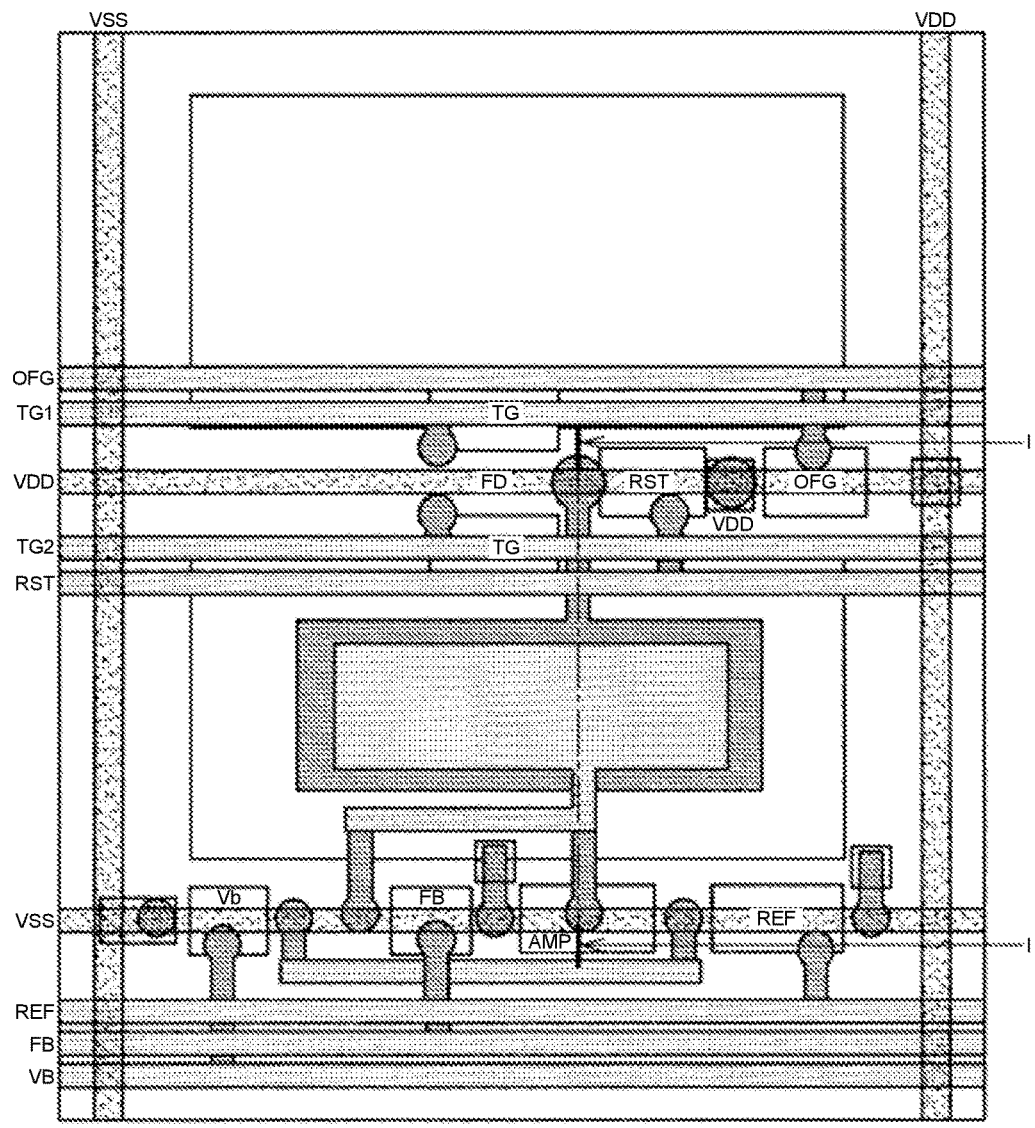
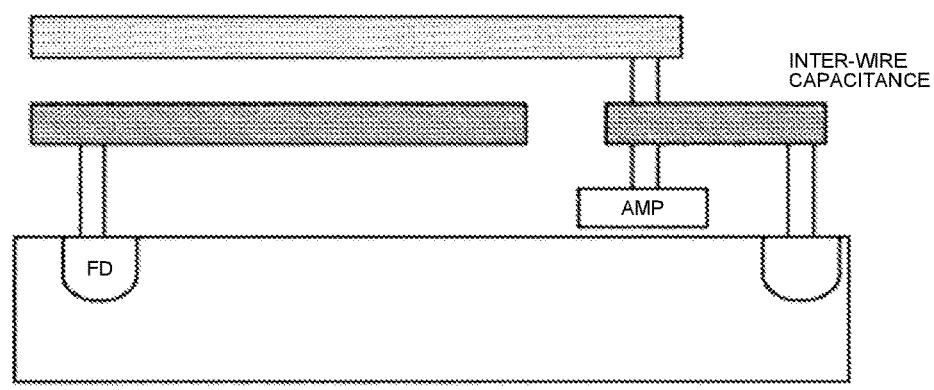

FIG.7F
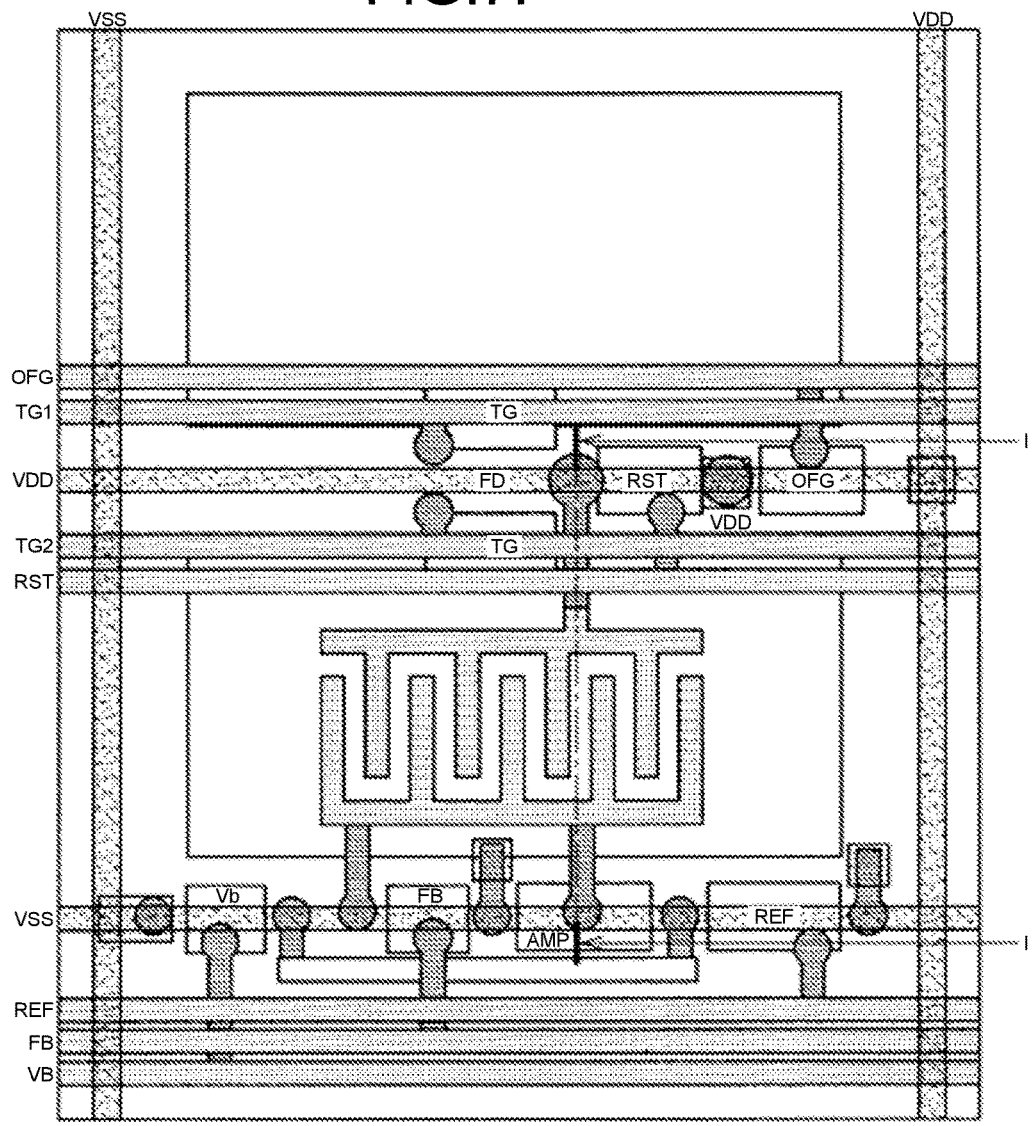
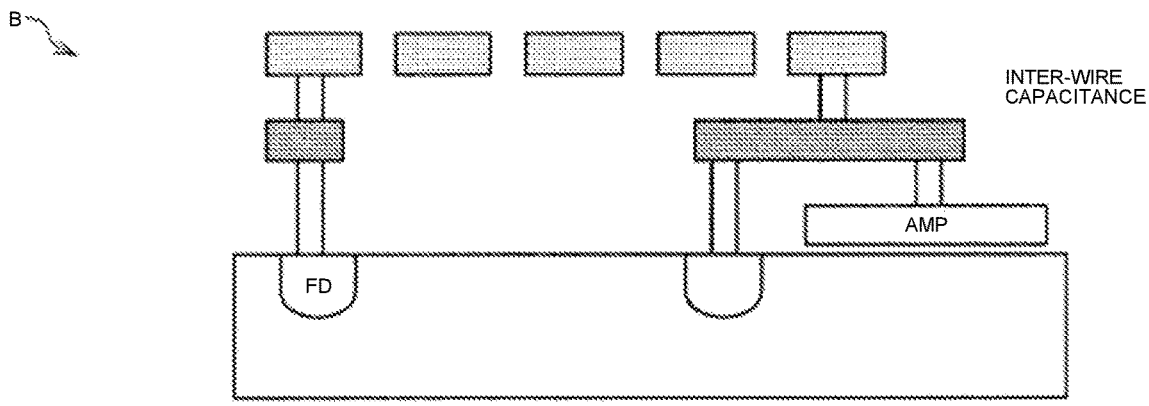

FIG.7G
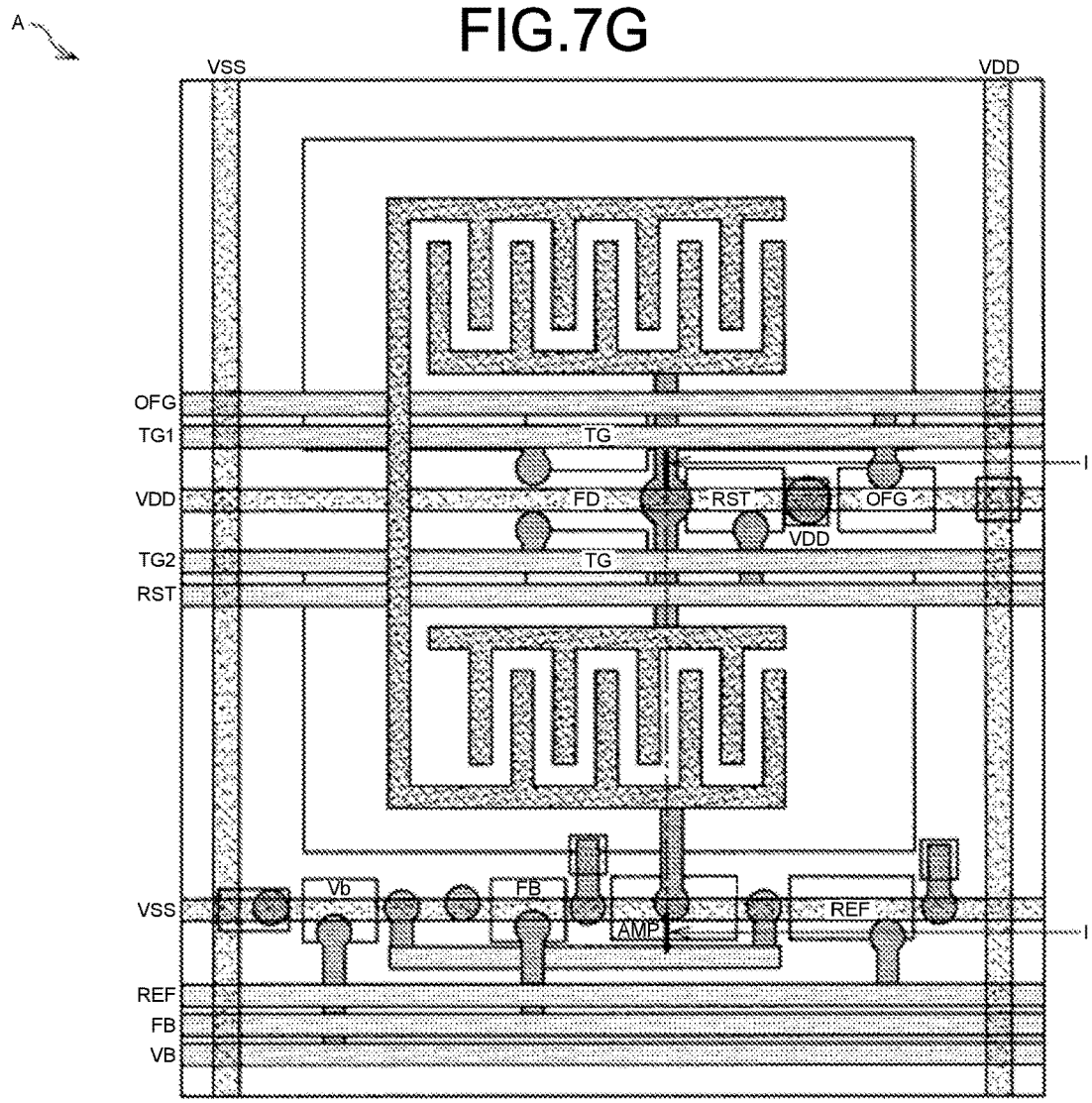
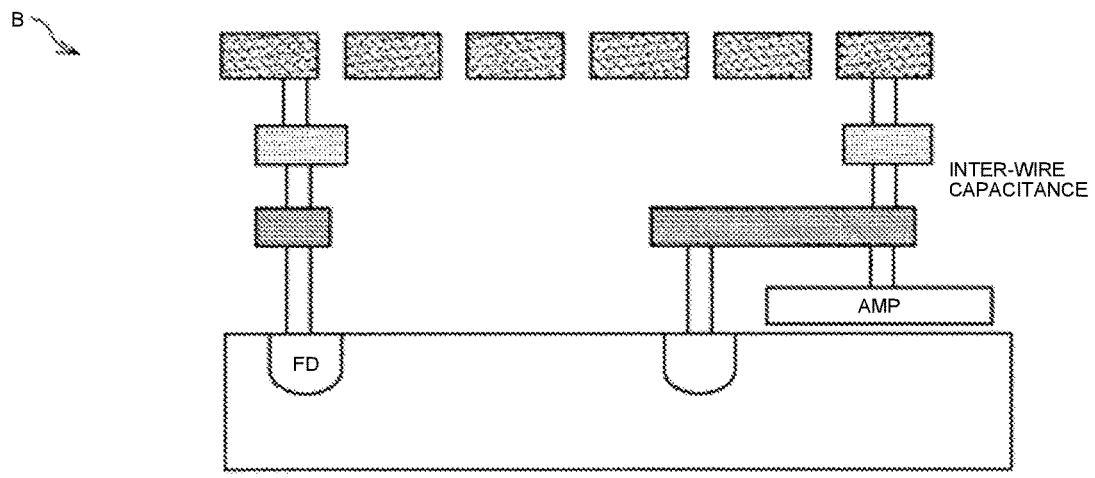

FIG.7H
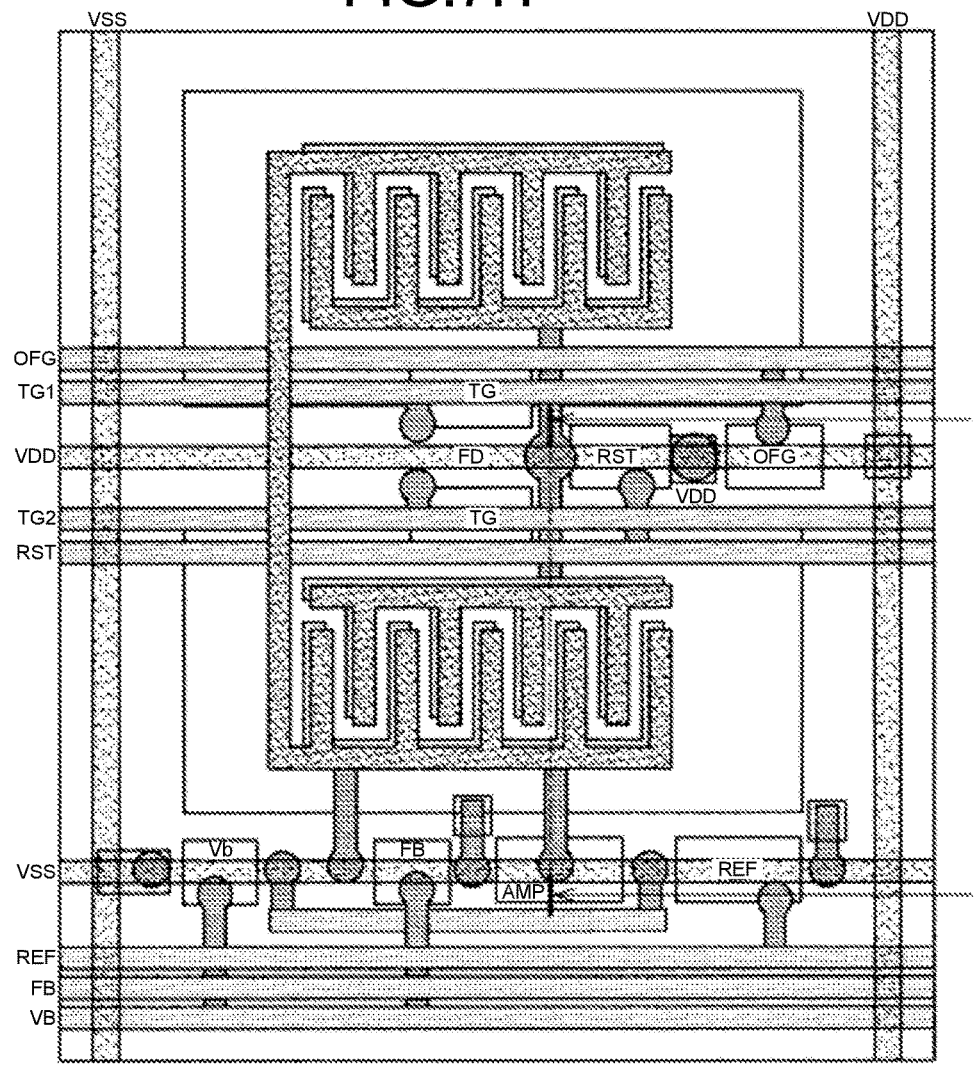
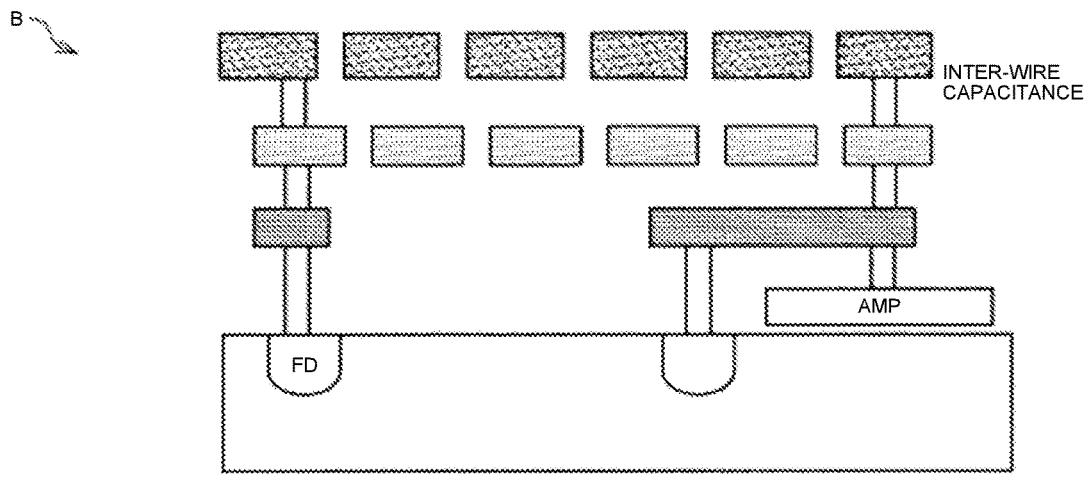

FIG.7I
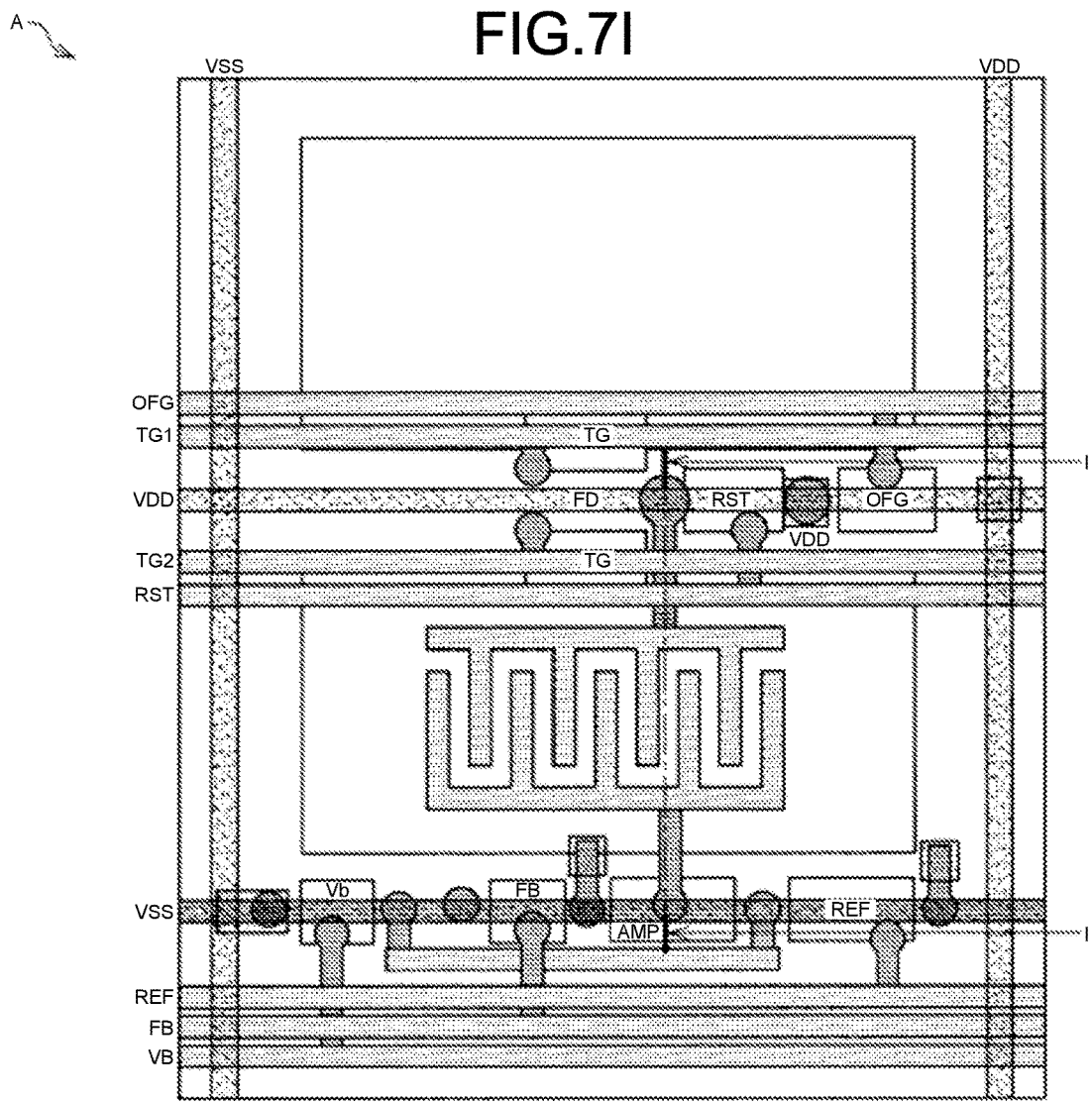
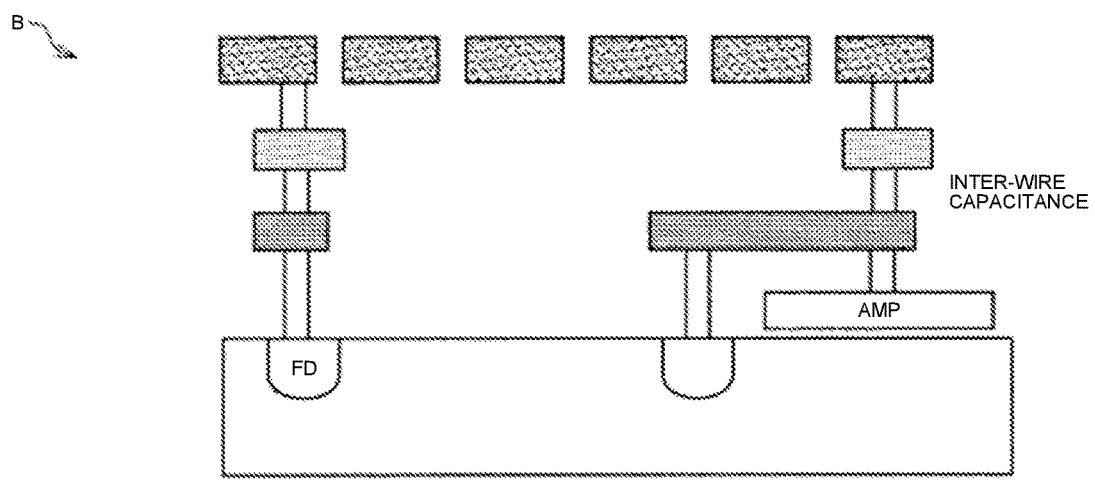

FIG.7J
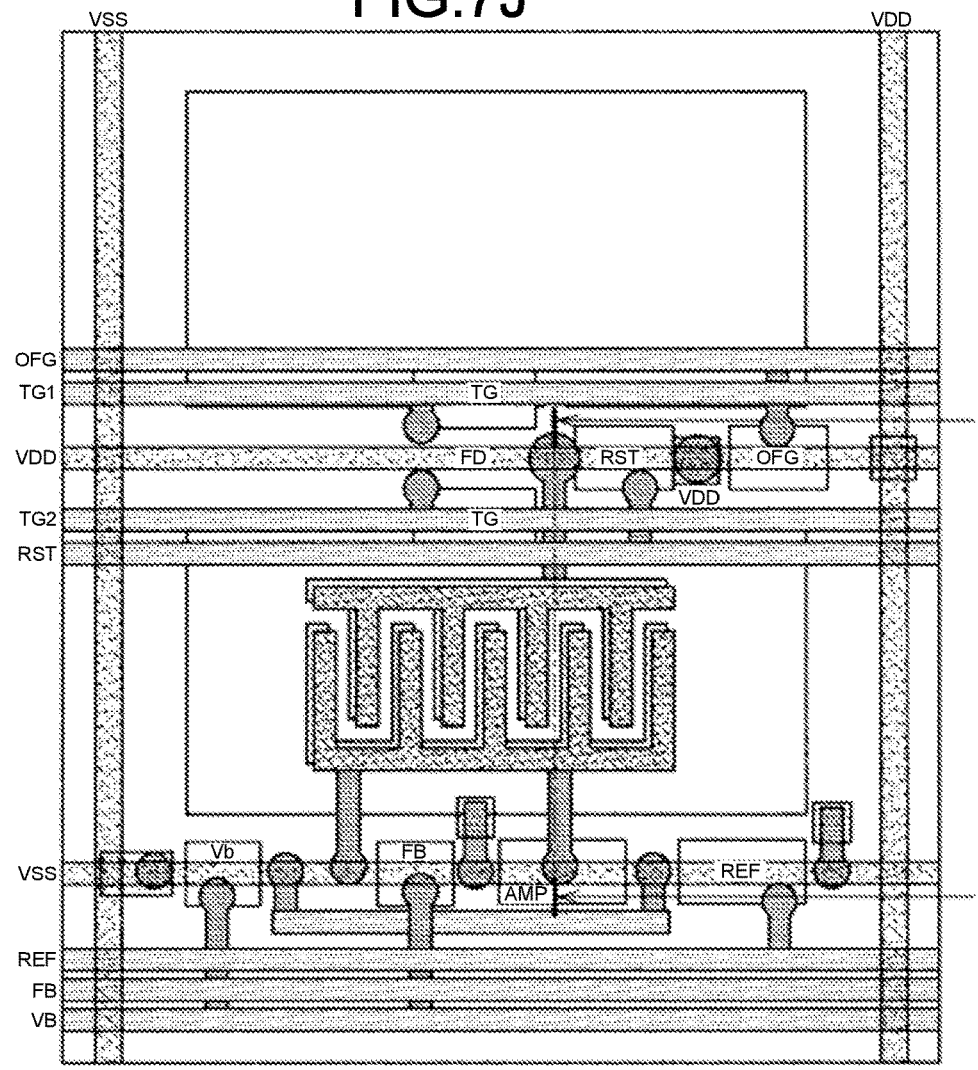
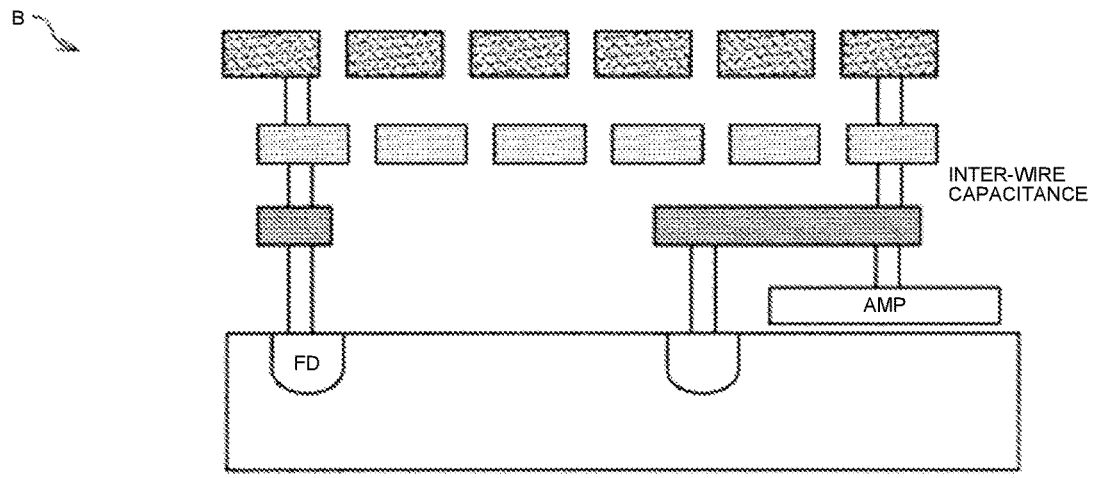

FIG.10
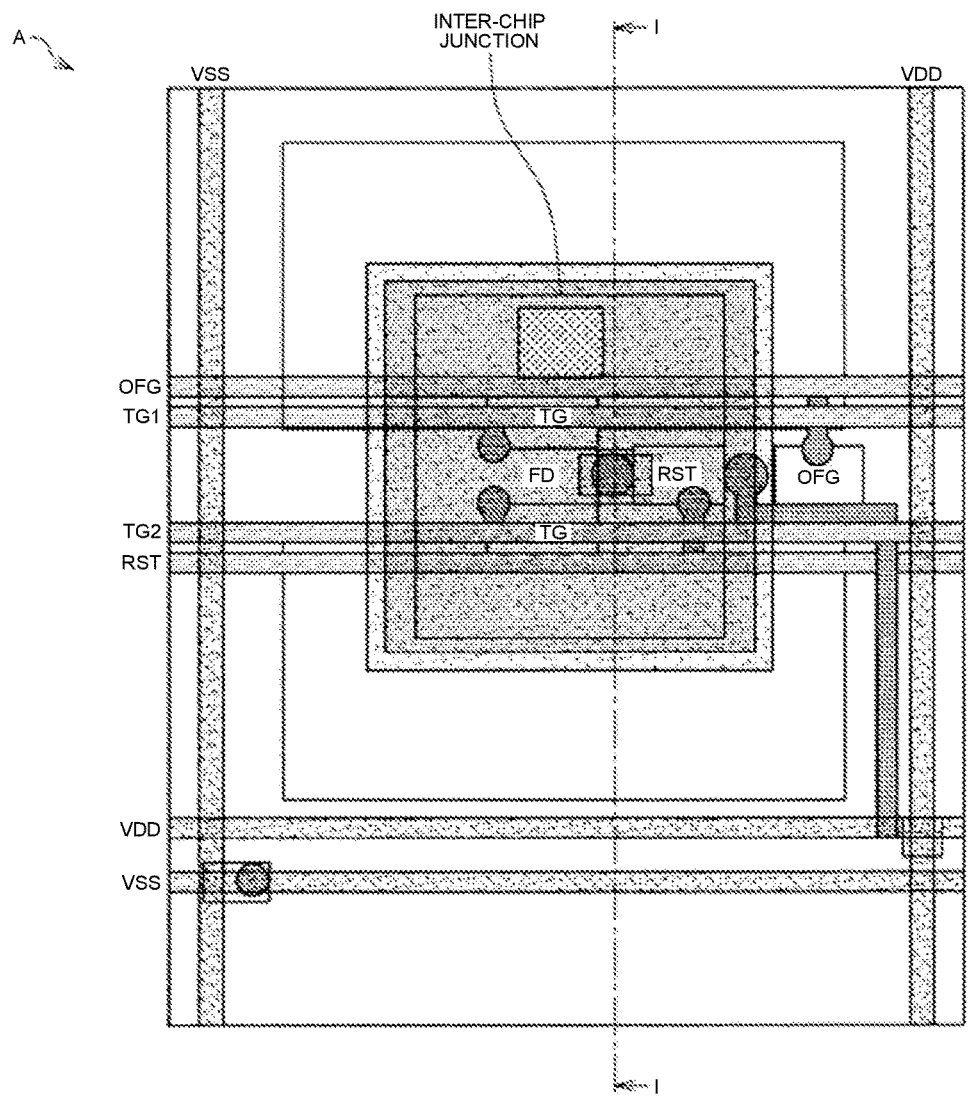
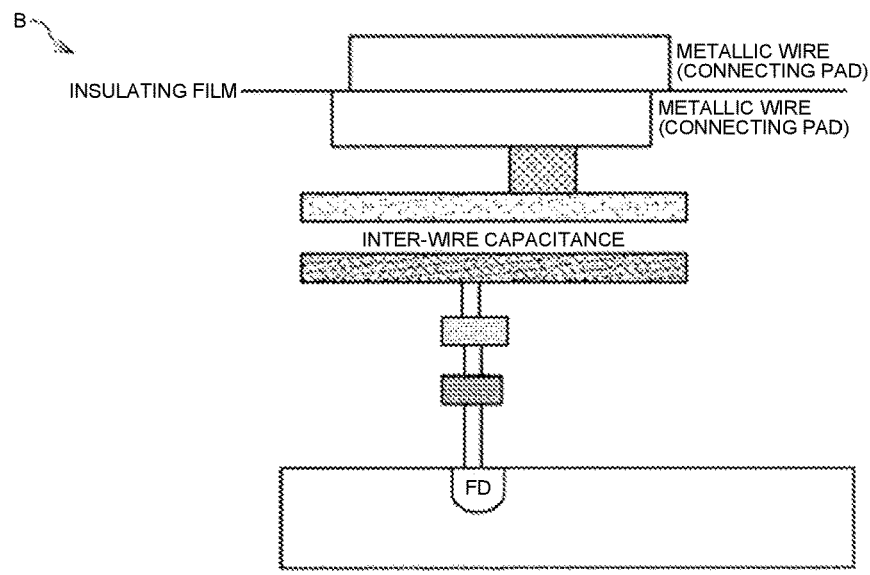

FIG.13
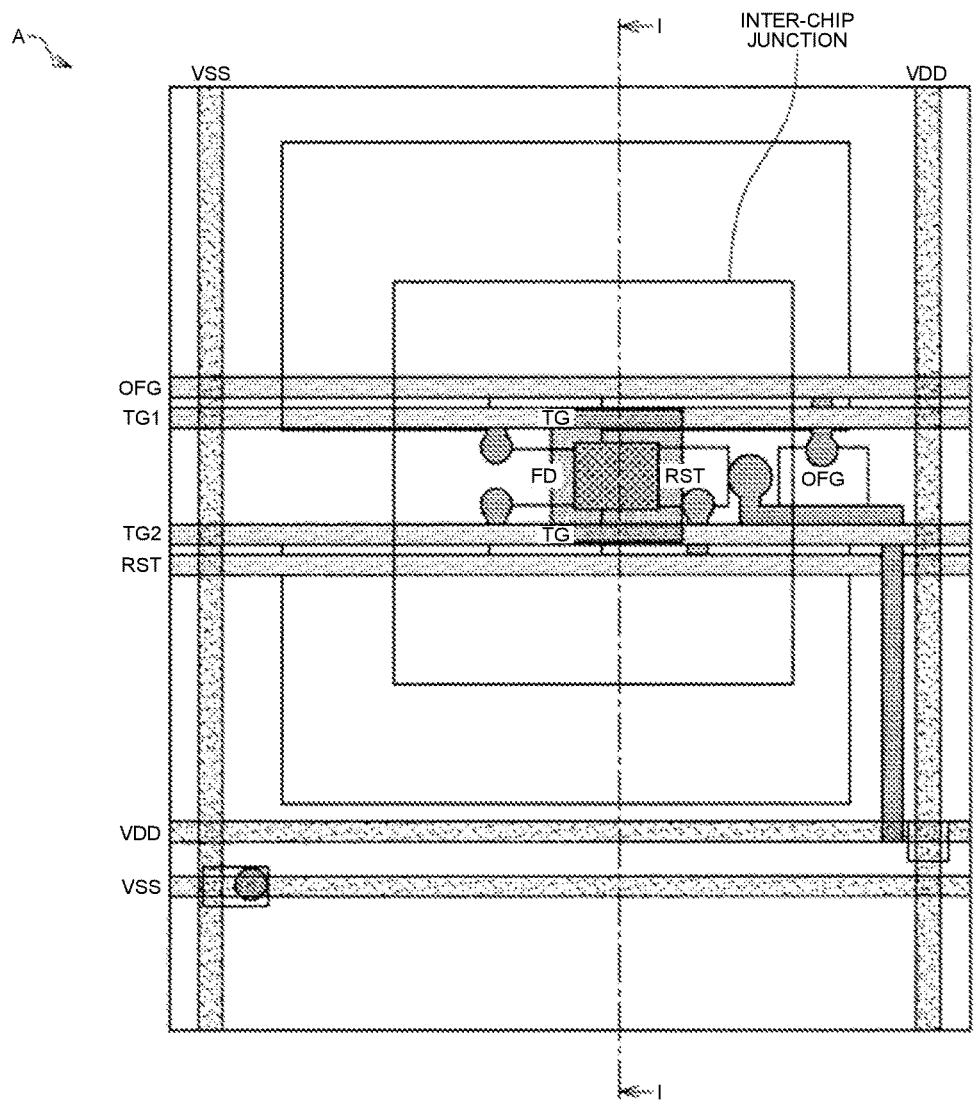
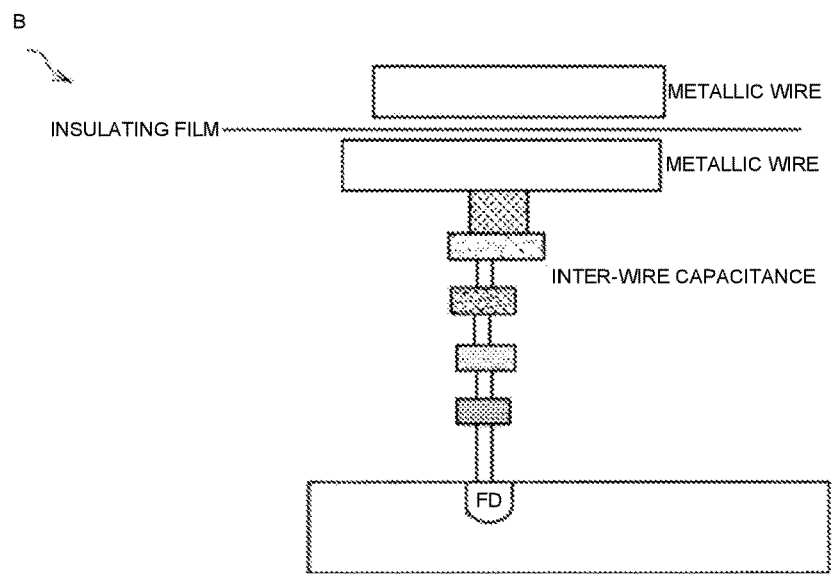

IMAGING APPARATUS

CROSS REFERENCE TO RELATED APPLICATION

This application is a continuation of U.S. application Ser. No. 16/636,147, filed Feb. 3, 2020 which is PCT Nationalization of PCT/JP2018/024329, filed Jun. 27, 2018 and claims priority to Japanese Priority Patent No. 2017-155855 filed Aug. 10, 2017 and the entire contents of which are incorporated herein by reference.

FIELD

The present disclose relates to an imaging apparatus.

BACKGROUND

Techniques about imaging elements acquiring high-quality images have been developed. Examples of a technique that acquires high-quality images by adaptively changing conversion efficiency when electric charges obtained through photoelectric conversion are converted into a voltage signal include a technique described in Patent Literature 1 below.

CITATION LIST

Patent Literature

Patent Literature 1: JP 2016-92661 A

SUMMARY

Technical Problem

In an imaging element described in Patent Literature 1, for example, a voltage signal obtained through photoelectric conversion is input to a differential amplifier circuit, and the voltage signal is amplified; the amplified voltage signal is converted into a digital signal by an analog-to-digital converter (an AD converter) provided for each pixel. The voltage signal is obtained by a floating diffusion layer accumulating electric charges obtained through photoelectric conversion and converting them into a voltage signal.

In the existing configuration in which the AD converter is provided for each pixel or for each plurality of pixels, and the voltage signal obtained through photoelectric conversion is input to the differential amplifier circuit and is amplified, the floating diffusion layer is reset when the differential amplifier circuit performs an Auto-zero operation. In the existing configuration, the reset potential of the floating diffusion layer inevitably reduces compared with a case of a source follower reading configuration owing to a voltage drop occurring in a transistor included in an output stage of the differential amplifier circuit. Examples of the voltage drop occurring in the transistor included in the output stage of the differential amplifier circuit include a voltage drop of about 0.30 [V] to 0.45 [V]. Consequently, the above configuration may reduce the dynamic range of the floating diffusion layer.

The present disclosure presents a novel, improved imaging apparatus capable of preventing a reduction in the dynamic range of the floating diffusion layer.

Solution to Problem

According to the present disclosure, an imaging apparatus is provided that includes an imaging unit having a plurality of pixels, the pixels each having: a conversion element converting incident light into photoelectrons; a floating diffusion layer electrically connected to the conversion element and converting the photoelectrons into a voltage signal; a differential amplifier circuit electrically connected to the floating diffusion layer, including an amplifier transistor to which a potential of the floating diffusion layer is input, and amplifying the potential of the floating diffusion layer; a feedback transistor electrically connected to the amplifier transistor and initializing the differential amplifier circuit; a clamp capacitance connected in series between the floating diffusion layer and the amplifier transistor; and a reset transistor connected in parallel between the floating diffusion layer and the clamp capacitance and initializing the potential of the floating diffusion layer.

Advantageous Effects of Invention

The present disclosure can prevent a reduction in the dynamic range of a floating diffusion layer.

The above effect is not necessarily limiting; any effect presented in the present specification or other effects that can be grasped from the present specification may be produced together with the above effect or in place of the above effect.

BRIEF DESCRIPTION OF DRAWINGS

FIG. 7A is an illustrative diagram of an exemplary layout of the pixel according to the first embodiment.

FIG. 7B is an illustrative diagram of an exemplary layout of the pixel according to the first embodiment.

FIG. 7C is an illustrative diagram of an exemplary layout of the pixel according to the first embodiment.

FIG. 7D is an illustrative diagram of an exemplary layout of the pixel according to the first embodiment.

FIG. 7E is an illustrative diagram of an exemplary layout of the pixel according to the first embodiment.

FIG. 7F is an illustrative diagram of an exemplary layout of the pixel according to the first embodiment.

FIG. 7G is an illustrative diagram of an exemplary layout of the pixel according to the first embodiment.

FIG. 7H is an illustrative diagram of an exemplary layout of the pixel according to the first embodiment.

FIG. 7I is an illustrative diagram of an exemplary layout of the pixel according to the first embodiment.

FIG. 7J is an illustrative diagram of an exemplary layout of the pixel according to the first embodiment.

FIG. 10 is a schematic illustrative diagram of an exemplary layout of the pixel according to the second embodiment.

FIG. 13 is an illustrative diagram of a layout of the pixel P according to the third embodiment.

DESCRIPTION OF EMBODIMENTS

Figure 1:
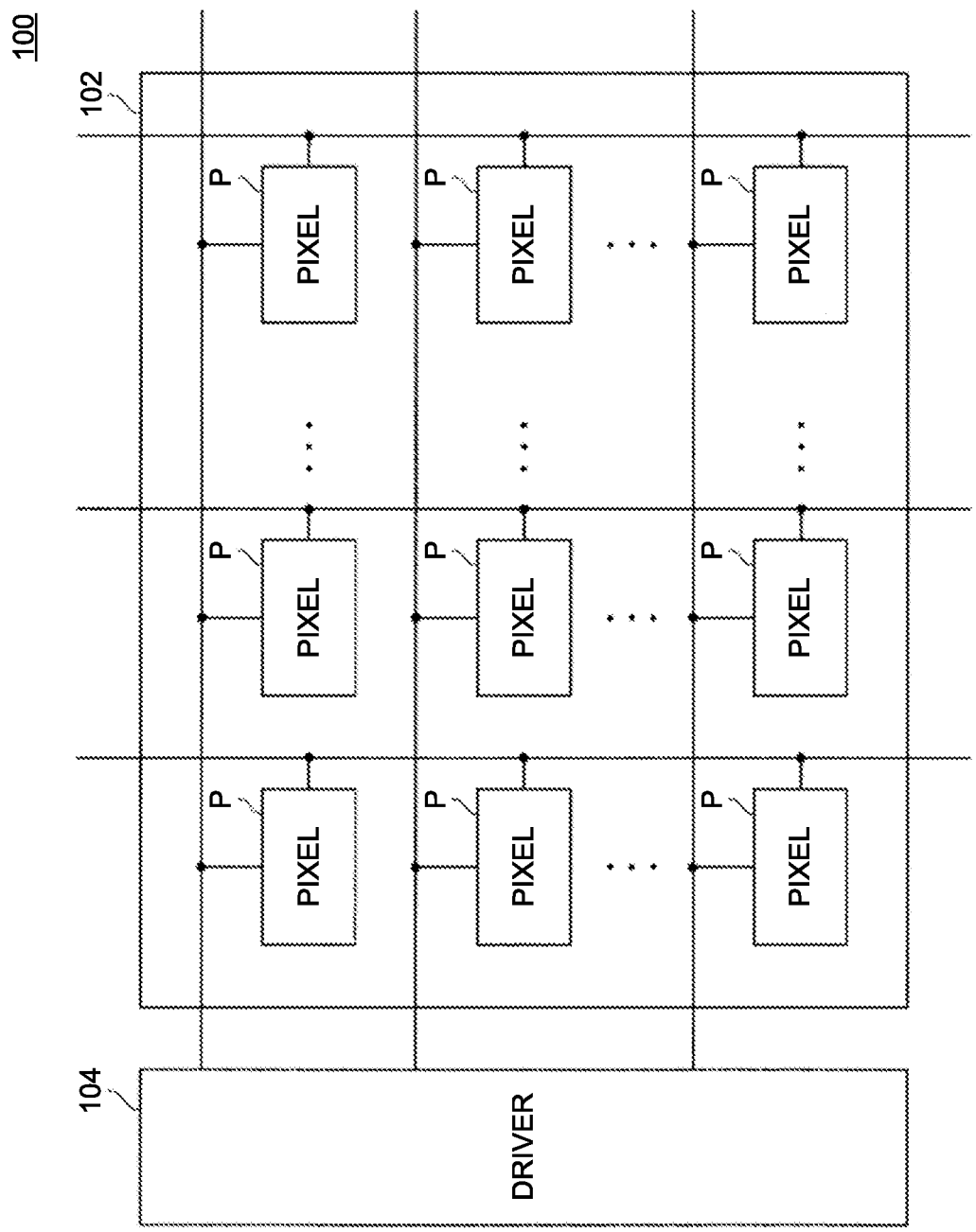
FIG. 1 is an illustrative diagram of an exemplary configuration of an imaging apparatus according to a first embodiment.

The following describes preferred embodiments of the present disclosure in detail with reference to the accompanying drawings. In the present specification and drawings, components having substantially the same function are denoted by the same symbols, thereby omitting a duplicate description.

In the following, "connecting one component and another component to each other" refers to "the one component and the other component being electrically connected to each other without involving any other components" or "the one component and the other component being electrically connected to each other via any other components".

The following describes the following items in order described below.

1. Imaging Apparatus According to Present Embodiment
[1] Outline of Imaging Apparatus According to Present Embodiment
[2] Imaging Apparatus According to First Embodiment
[3] Imaging Apparatus According to Second Embodiment
[4] Imaging Apparatus According to Third Embodiment
[5] Imaging Apparatus According to Another Embodiment
[6] Effects Produced by Imaging Apparatus According to Present Embodiment
2. Application Examples of Imaging Apparatus According to Present Embodiment
(Imaging Apparatus According to Present Embodiment)
[1] Outline of Imaging Apparatus According to Present Embodiment As described above, in the existing configuration in which an AD converter is provided for each pixel or for each plurality of pixels, and a voltage signal obtained through photoelectric conversion is input to a differential amplifier circuit and is amplified, the reset potential of a floating diffusion layer reduces by an amount corresponding to a voltage drop occurring in the differential amplifier circuit, and the dynamic range of the floating diffusion layer may reduce.

Given these circumstances, the imaging apparatus according to the present embodiment has a configuration preventing the voltage drop occurring in the differential amplifier circuit from having an influence on the reset potential of the floating diffusion layer to prevent the reduction in the dynamic range of the floating diffusion layer.

More specifically, a pixel of the imaging apparatus according to the present embodiment has "a configuration in which a clamp capacitance is connected in series between an input terminal of the differential amplifier circuit and the floating diffusion layer, whereas a reset transistor initializing the potential of the floating diffusion layer is connected in parallel between the floating diffusion layer and the clamp capacitance". Having the above configuration, the potential of the floating diffusion layer can be initialized while preventing the voltage drop occurring in the differential amplifier circuit from having an influence on the reset potential of the floating diffusion layer. Having the above configuration, the voltage drop occurring in the differential amplifier circuit is prevented from having an influence on the reset potential of the floating diffusion layer, thus preventing the reduction in the dynamic range of the floating diffusion layer.

The following describes a configuration of the imaging apparatus according to the present embodiment.

[2] Imaging Apparatus According to First Embodiment

The following first describes an imaging apparatus according to a first embodiment. FIG. 1 is an illustrative diagram of an exemplary configuration of an imaging apparatus 100 according to the first embodiment.

The imaging apparatus 100 includes an imaging unit 102 having a plurality of pixels P each performing photoelectric conversion and a driver 104 driving the pixel circuit P, for example. The imaging apparatus 100 is driven by power supplied from an internal power supply such as a battery or power supplied from an external power supply.

The imaging unit 102 includes a pixel array in which a plurality of pixels P are arranged in a matrix manner. The pixels P are each electrically connected to the driver 104 via signal lines. Although FIG. 1 illustrates an example in which each pixel is connected to the driver 104 via one signal line for convenience, the driver 104 and each of the pixels P may be connected to each other via a plurality of signal lines. In the pixel P, accumulation of signal electric charges corresponding to incident light made incident, initialization of the pixel P, and the like are performed by a control signal transmitted from the driver 104 via the signal line.

The imaging unit 102 includes one board or a plurality of laminated boards, for example. When the imaging unit 102 includes the laminated boards, among the components included in the pixel P, at least a conversion element (described below), a floating diffusion layer (described below), and a reset transistor (described below) are provided on the same board. The following exemplifies a case in which the imaging unit 102 includes two laminated boards.

An exemplary configuration of the pixel P according to the first embodiment will be described below.

The configuration of the imaging apparatus according to the first embodiment is not limited to the example illustrated in FIG. 1.

The imaging apparatus according to the first embodiment does not necessarily include the driver 104, and each of the pixels P may be driven by a control signal transmitted from an external driver via a signal line, for example.

The imaging apparatus according to the first embodiment may further include a conversion unit (not illustrated) converting an analog signal output from the pixel P included in the imaging unit 102 into a digital signal. The conversion unit (not illustrated) has a conversion circuit converting the analog signal into the digital signal for each pixel P or for each plurality of pixels P and converts the analog signal output from the pixel P into the digital signal by the conversion circuit.

Examples of the conversion circuit according to the present embodiment include an AD converter with the gain of the analog signal to be converted into the digital signal fixed. Examples of the AD converter include any types of AD converters such as a successive approximation AD converter. The conversion circuit according to the present embodiment may be able to adjust the gain of the analog signal to be converted into the digital signal (be able to switch the gain of the analog signal).

The following describes the exemplary configuration of the pixel P of the imaging apparatus 100 with the imaging apparatus 100 illustrated in FIG. 1 exemplified.

The following exemplifies a case in which transistors included in the pixel P are each an N-channel or P-channel metal-oxide-semiconductor field effect transistor (MOSFET). The transistors included in the pixel P are not limited to the MOSFET. The transistors included in the pixel P may be any field-effect transistor (FET) such as a bipolar transistor or a thin-film transistor (TFT), for example. The polarity of the transistors included in the pixel P is not limited to the following example and can be changed in accordance with a signal to be applied to a control terminal of each of the transistors.

[2-1] Exemplary Configuration of Pixel P According to First Embodiment

Figure 2:
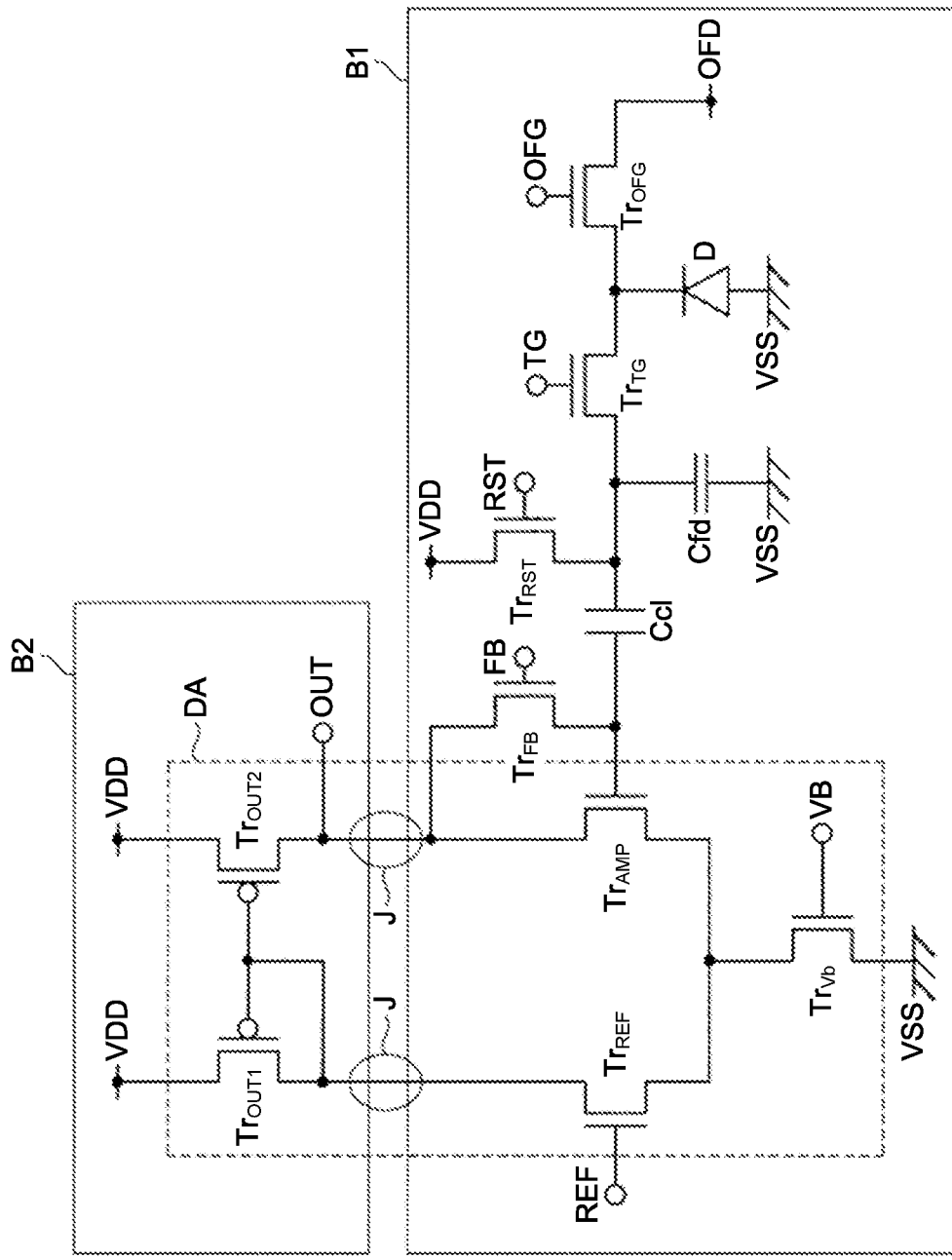
FIG. 2 is an illustrative diagram of an exemplary configuration of a pixel according to the first embodiment.

FIG. 2 is an illustrative diagram of an exemplary configuration of the pixel P according to the first embodiment. FIG. 2 illustrates an example in which the pixel P includes two boards including a first board B1 and a second board B2.

The pixel P according to the first embodiment includes a conversion element D, a floating diffusion layer Cfd, a differential amplifier circuit DA, a feedback transistor $Tr_{FB}$, a clamp capacitance Ccl, and a reset transistor $Tr_{RST}$, for example.

A transfer transistor $Tr_{TG}$ transferring electric charges corresponding to the conversion of incident light by the conversion element D to the floating diffusion layer Cfd is connected between the conversion element D and the floating diffusion layer Cfd. The transfer transistor $Tr_{TG}$ becomes an on state (a conductive state) by an applied control signal TG, whereby the electric charges corresponding to the conversion of the incident light by the conversion element D are transferred to the floating diffusion layer Cfd. In the following, the transfer transistor $Tr_{TG}$ may be denoted as "TG".

An overflow drain transistor $Tr_{OFG}$ transferring electric charges to the overflow drain OFD is connected between the conversion element D and the overflow drain OFD discharging electric charges. The overflow drain transistor $Tr_{OFG}$ becomes an on state by an applied control signal OFG, whereby the electric charges corresponding to the conversion of the incident light by the conversion element D are transferred to the overflow drain OFD. In the following, the overflow drain transistor $Tr_{OFG}$ may be denoted as "OFG". Excessive electric charges from the conversion element D can also be discharged to a power supply terminal (VDD) via the transfer transistor $Tr_{TG}$ and the reset transistor $Tr_{RST}$. When the excessive electric charges from the conversion element D are discharged to the power supply terminal as described above, OFG and OFD illustrated in FIG. 2 can be omitted.

The conversion element D converts incident light into photoelectrons. Examples of the conversion element D include any light-receiving elements capable of converting incident light into photoelectrons such as a photodiode.

The floating diffusion layer Cfd is connected to the conversion element D and converts the photoelectrons converted by the conversion element D into a voltage signal. The floating diffusion layer Cfd plays a role of accumulating the electric charges transferred from the conversion element D and converting the accumulated electric charges into the voltage signal and outputting it.

The differential amplifier circuit DA is a differential amplifier circuit with a general configuration including transistors. The differential amplifier circuit DA includes "an amplifier transistor $Tr_{AMP}$ that is connected to the floating diffusion layer Cfd and to which the voltage signal converted by the floating diffusion layer Cfd (the potential of the floating diffusion layer Cfd, hereinafter the same) is input" and "a reference transistor $Tr_{REF}$ to which a reference signal (an exemplary control signal) is input" as transistors of an input stage to amplify the voltage signal. A control terminal of the amplifier transistor $Tr_{AMP}$ is connected to the floating diffusion layer Cfd via the clamp capacitance Ccl.

Transistors $Tr_{OUT1}$ and $Tr_{OUT2}$ included in the differential amplifier circuit DA are transistors included in an output stage of the differential amplifier circuit. In the following, the amplifier transistor $Tr_{ANT}$ may be denoted as "AMP", whereas the reference transistor $Tr_{REF}$ may be denoted as "REF".

The feedback transistor $Tr_{FB}$ is connected to the amplifier transistor $Tr_{AMP}$ and initializes the differential amplifier circuit DA. The feedback transistor $Tr_{FB}$ becomes an on state, whereby the control terminal and another terminal of the amplifier transistor $Tr_{AMP}$ are connected to each other, the potential of the control terminal of the amplifier transistor $Tr_{AMP}$ becomes an initialized potential of the differential amplifier circuit DA, and the differential amplifier circuit DA is initialized. In the following, the operation of the differential amplifier circuit DA when the feedback transistor $Tr_{FB}$ becomes the on state may be denotes as "an Auto-zero operation".

The clamp capacitance Ccl is connected in series between the floating diffusion layer Cfd and the amplifier transistor $Tr_{Amp}$. Examples of the clamp capacitance Ccl include capacitive elements such as inter-wire capacitances and capacitors. The clamp capacitance Ccl is provided so as to be a capacitance sufficiently larger than a control terminal capacitance of the amplifier transistor $Tr_{AMP}$ and an inter-wire capacitance added to the control terminal of the amplifier transistor $Tr_{AMP}$.

The reset transistor $Tr_{RST}$ is connected in parallel between the floating diffusion layer Cfd and the clamp capacitance Ccl and initializes the potential of the floating diffusion layer Cfd. The reset transistor $Tr_{RST}$ becomes an on state to initialize the potential of the floating diffusion layer Cfd.

Figure 3:
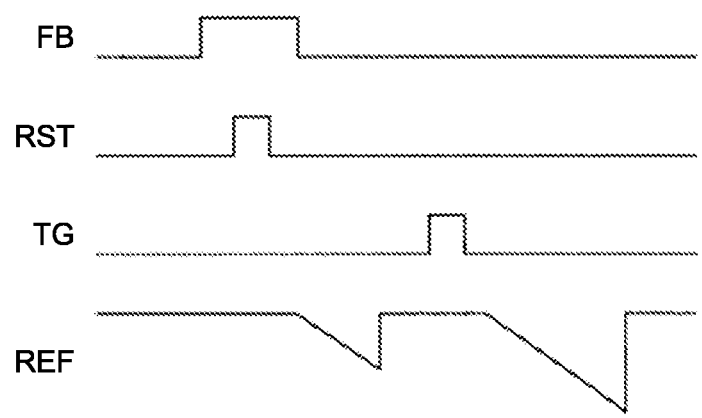
FIG. 3 is an illustrative diagram of an exemplary operation of the pixel according to the first embodiment.

FIG. 3 is an illustrative diagram of an exemplary operation in the pixel P according to the first embodiment. Various control signals illustrated in FIG. 3 are supplied from the driver 104 (or an external driver), for example.

The following first describes an operation to initialize the potential of the floating diffusion layer Cfd and transfer of the electric charges from the conversion element D to the floating diffusion layer Cfd.

As illustrated in FIG. 3, in the pixel P, when the differential amplifier circuit DA is performing the Auto-zero operation (when the feedback transistor $Tr_{FB}$ is in the on state), the reset transistor $Tr_{RST}$ becomes the on state, and the potential of the floating diffusion layer Cfd is initialized. In this process, the control terminal of the amplifier transistor $Tr_{AMP}$ (the terminal of the amplifier transistor $Tr_{AMP}$ connected to the floating diffusion layer Cfd) is fixed to the initialized potential of the differential amplifier circuit DA.

After the potential of the floating diffusion layer Cfd is initialized (after the reset transistor $Tr_{RST}$ becomes an off state (a non-conductive state) from the on state), the Auto-zero operation of the differential amplifier circuit DA ends in the pixel P.

After the Auto-zero operation of the differential amplifier circuit DA ends, the transfer transistor $Tr_{TG}$ becomes the on state, whereby the conversion element D and the floating diffusion layer Cfd are connected to each other, and the electric charges corresponding to the conversion of the incident light by the conversion element D are transferred to the floating diffusion layer Cfd.

The following describes an operation when the voltage signal detected by the floating diffusion layer Cfd is detected.

As illustrated in FIG. 3, after transfer of the electric charges from the conversion element D to the floating diffusion layer Cfd is performed (after the transfer transistor $Tr_{TG}$ becomes an off state from the on state), the feedback transistor $Tr_{FB}$ is in an off state, and the control terminal of the amplifier transistor $Tr_{AMP}$ (the terminal of the amplifier transistor $Tr_{AMP}$ connected to the floating diffusion layer Cfd) electrically floats. In this process, the voltage signal obtained by the floating diffusion layer Cfd is applied to the control terminal of the amplifier transistor $Tr_{Amp}$, and the voltage signal obtained by the floating diffusion layer Cfd is detected in the pixel P.

It is understood that the example of the various kinds of control signals to be supplied to the pixel P according to the first embodiment is not limited to the example illustrated in FIG. 3.

The pixel P according to the first embodiment has a configuration illustrated in FIG. 2, for example.

As illustrated in FIG. 2, in the pixel P according to the first embodiment, the conversion element D, the floating diffusion layer Cfd, part of the differential amplifier circuit DA including the amplifier transistor $Tr_{AMP}$, the feedback transistor $Tr_{FB}$, the clamp capacitance Ccl, and the reset transistor $Tr_{RST}$ are provided on the first board B1 as the same board. As illustrated in FIG. 2, in the pixel P according to the first embodiment, the output stage of the differential amplifier circuit DA (the other part of the differential amplifier circuit DA) is provided on the second board B2. Consequently, the pixel P according to the first embodiment has two inter-board junctions J between the first board B1 and the second board B2.

The configuration of the pixel P according to the first embodiment is not limited to the example illustrated in FIG. 2.

A plurality of pixels P may share the floating diffusion layer Cfd, the differential amplifier circuit DA, the feedback transistor $Tr_{FB}$, the clamp capacitance Ccl, and the reset transistor $Tr_{RST}$, for example.

Figure 4:
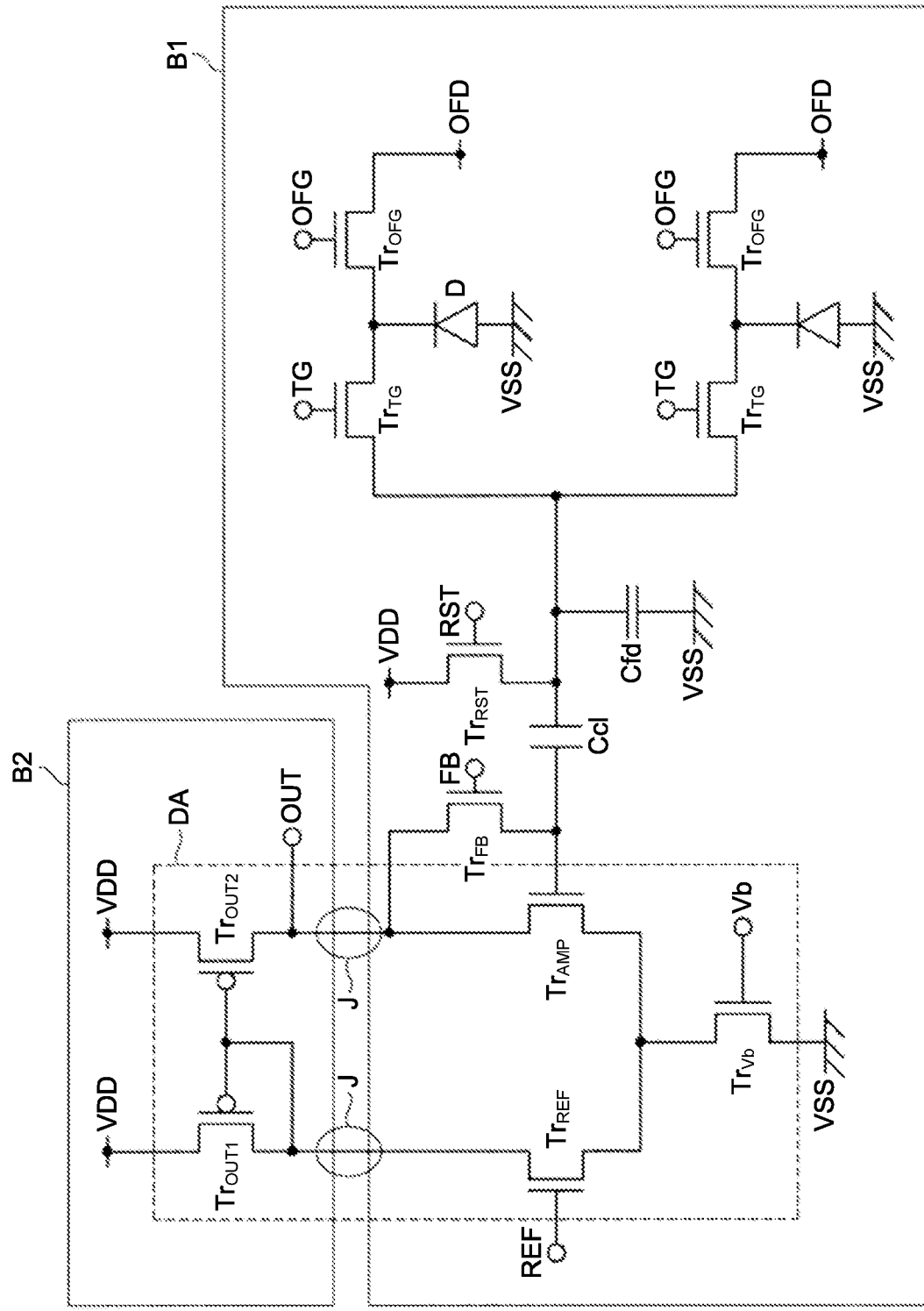
FIG. 4 is an illustrative diagram of another example of the configuration of the pixel according to the first embodiment.

FIG. 4 is an illustrative diagram of another example of the configuration of the pixel P according to the first embodiment and illustrates an exemplary configuration of "a case in which two pixels P share the floating diffusion layer Cfd, the differential amplifier circuit DA, the feedback transistor $Tr_{FB}$, the clamp capacitance Ccl, and the reset transistor $Tr_{RST}$".

When the imaging unit 102 has the pixel P of the configuration illustrated in FIG. 4, the conductive states of the transfer transistors $Tr_{TG}$ of the respective pixels P sharing the floating diffusion layer Cfd and the like are controlled by the control signal TG, whereby the electric charges corresponding to the conversion of the incident light by the conversion elements D of the respective pixels P are each transferred to the floating diffusion layer Cfd.

Although FIG. 4 illustrates an example in which two pixels P share the floating diffusion layer Cfd and the like, three or more pixels P may share the floating diffusion layer Cfd and the like in the imaging unit 102. As an example, the imaging apparatus 100 according to the first embodiment can have a configuration in which four pixels P share the floating diffusion layer Cfd and the like or a configuration in which eight pixels P share the floating diffusion layer Cfd and the like. Even when three or more pixels P share the floating diffusion layer Cfd and the like, the conductive states of the transfer transistors $Tr_{TG}$ of the respective pixels P are controlled, whereby the electric charges corresponding to the conversion of the incident light by the conversion elements D of the respective pixels P can each be transferred to the floating diffusion layer Cfd.

[2-2] Layout of Pixel P According to First Embodiment

The following shows an exemplary layout of the pixel P according to the first embodiment.

Figure 5:
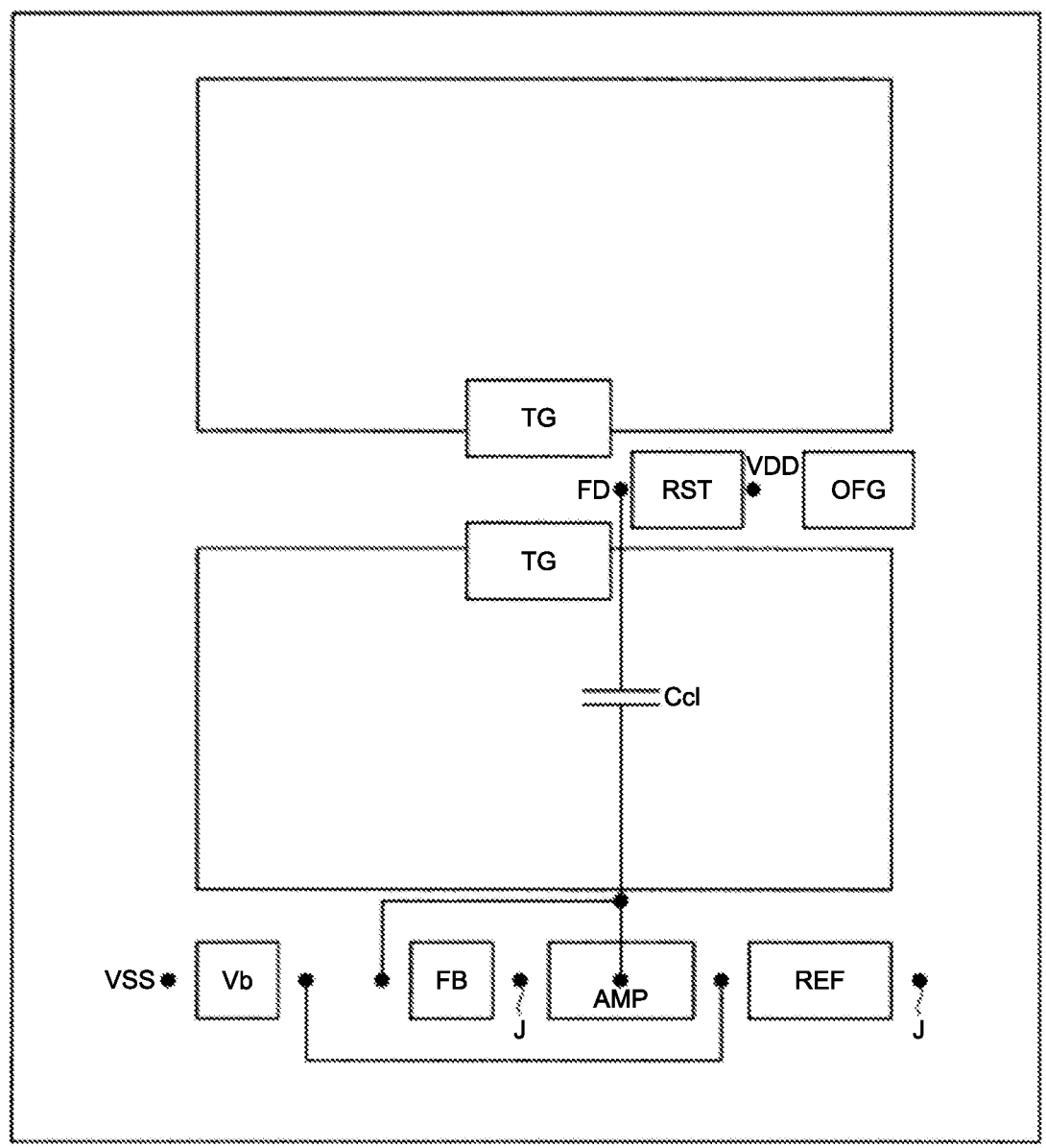
FIG. 5 is a schematic illustrative diagram of an exemplary layout of the pixel according to the first embodiment.
Figure 6:
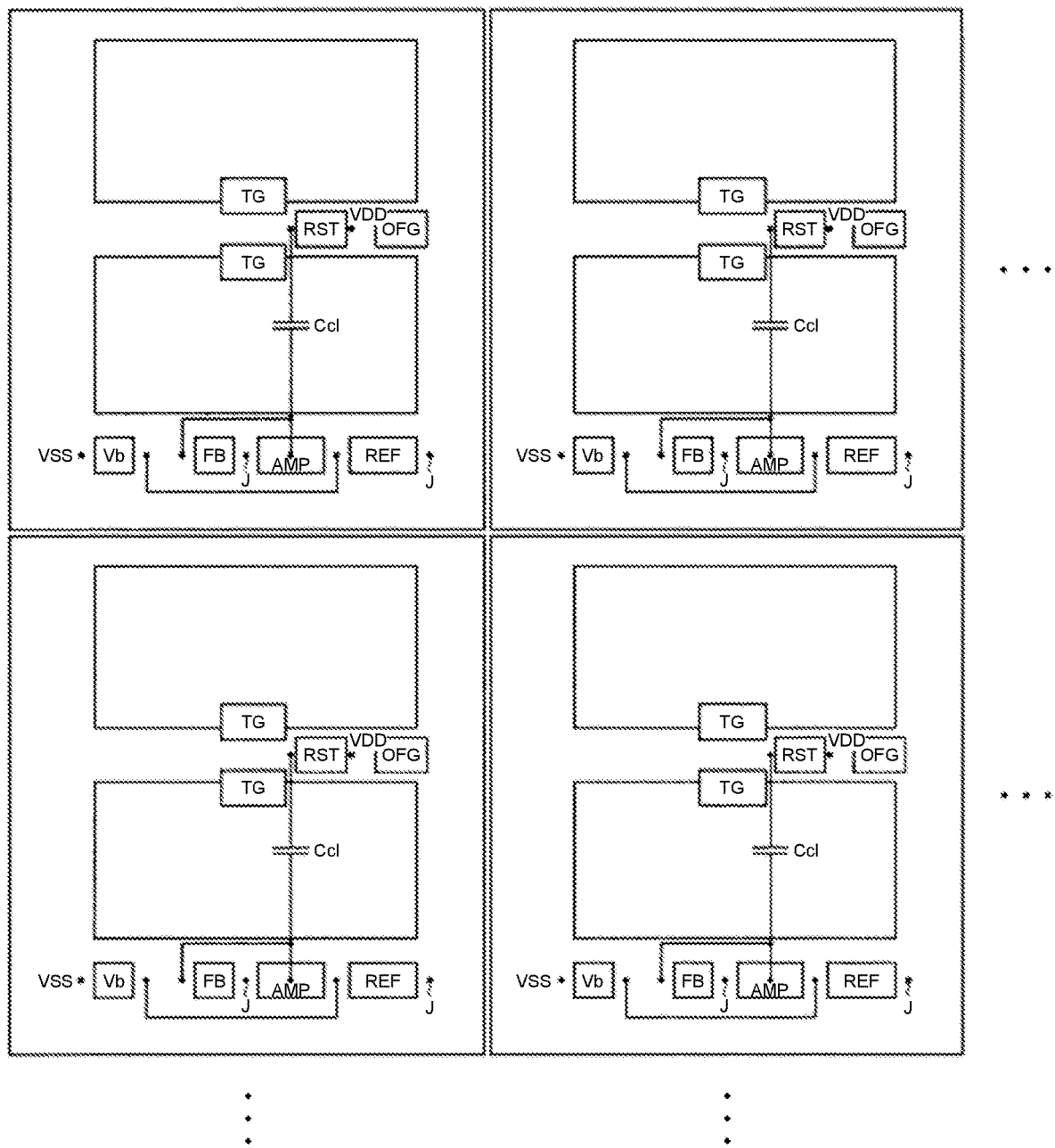
FIG. 6 is a schematic illustrative diagram of an exemplary layout of the pixel according to the first embodiment.

FIG. 5 and FIG. 6 are each a schematic illustrative diagram of an exemplary layout of the pixel P according to the first embodiment. FIG. 5 illustrates a schematic layout when the pixel P has the configuration illustrated in FIG. 4. FIG. 6 illustrates an exemplary pixel array in which the pixels P having the layout illustrated in FIG. 5 are arranged in a matrix manner.

FIG. 7A to FIG. 7J are each an illustrative diagram of an exemplary layout of the pixel P according to the first embodiment and each illustrate an exemplary layout when the pixel P has the configuration illustrated in FIG. 4. B illustrated in FIGS. 7A to 7J are each a schematic diagram of the I-I line section each illustrated in A illustrated in FIGS. 7A to 7J.

As illustrated in FIGS. 7A to 7J, the pixel P according to the first embodiment can be achieved by various numbers of wire patterns. It is understood that the layout of the pixel P according to the first embodiment is not limited to the examples illustrated in FIGS. 7A to 7J.

[3] Imaging Apparatus According to Second Embodiment

The following describes an imaging apparatus according to a second embodiment. The imaging apparatus according to the second embodiment has a configuration (including modifications) basically similar to the imaging apparatus according to the first embodiment described above, in which the configuration of the pixel P is different from that of the pixel P of the imaging apparatus according to the first embodiment described above. Given these circumstances, the following omits descriptions of points similar to those of the imaging apparatus according to the first embodiment described above in the imaging apparatus according to the second embodiment and describes an exemplary configuration of the pixel P according to the second embodiment.

[3-1] Exemplary Configuration of Pixel P According to Second Embodiment

Figure 8:
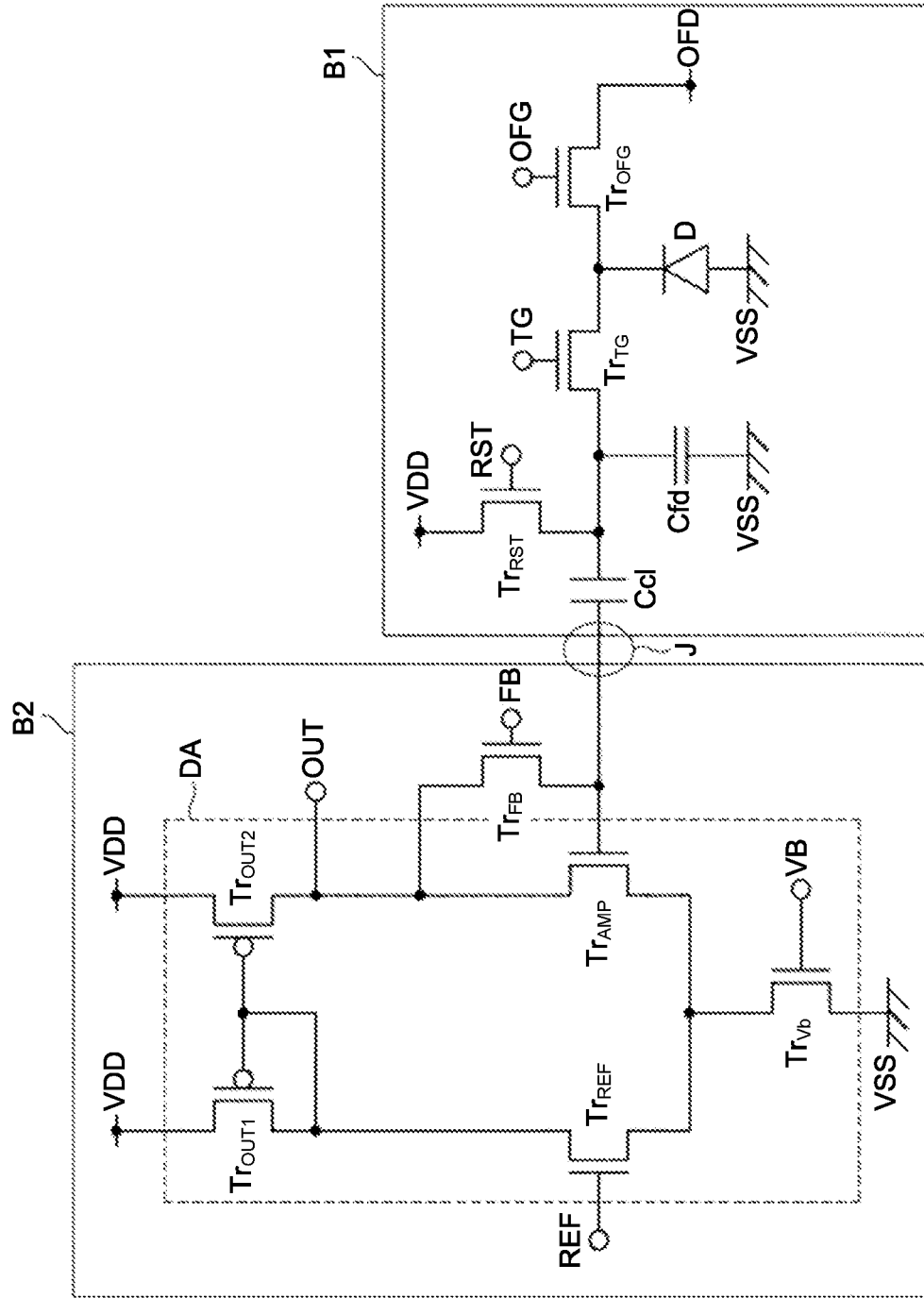
FIG. 8 is an illustrative diagram of an exemplary configuration of the pixel according to a second embodiment.

FIG. 8 is an illustrative diagram of an exemplary configuration of the pixel P according to the second embodiment. FIG. 8 illustrates an example in which the pixel P includes two boards including the first board B1 and the second board B2.

The pixel P according to the second embodiment includes the conversion element D, the floating diffusion layer Cfd, the differential amplifier circuit DA, the feedback transistor $Tr_{FB}$, the clamp capacitance Ccl, and the reset transistor $Tr_{RST}$, for example.

A difference between the pixel P according to the second embodiment and the pixel P according to the first embodiment is a component provided in each of the first board B1 and the second board B2.

More specifically, as illustrated in FIG. 8, in the pixel P according to the second embodiment, the conversion element D, the floating diffusion layer Cfd, the clamp capacitance Ccl, and the reset transistor $Tr_{RST}$ are provided on the first board B1 as the same board. As illustrated in FIG. 8, in the pixel P according to the second embodiment, the differential amplifier circuit DA and the feedback transistor $Tr_{FB}$ are provided on the second board B2. Consequently, the pixel P according to the second embodiment has one inter-board junction J between the first board B1 and the second board B2 and can thus reduce the number of the inter-board junctions J compared with the first embodiment.

As illustrated in FIG. 8, for example, the differential amplifier circuit DA is provided on the board different from the first board B1 on which the conversion element D and the like are provided, whereby an Si area in which the differential amplifier circuit DA is provided can be enlarged. Consequently, the dimensions of the transistors included in the differential amplifier circuit DA can be ensured to be sufficiently large without being limited by the size of the pixel P, and reduction of characteristics such as P (precharge) phase variations are prevented, whereby the analog circuit characteristics of the differential amplifier circuit DA can be improved.

The configuration of the pixel P according to the second embodiment is not limited to the example illustrated in FIG. 8.

Like the first embodiment, a plurality of pixels P may share the floating diffusion layer Cfd, the differential amplifier circuit DA, the feedback transistor $Tr_{FB}$, the clamp capacitance Ccl, and the reset transistor $Tr_{RST}$, for example.

Figure 9:
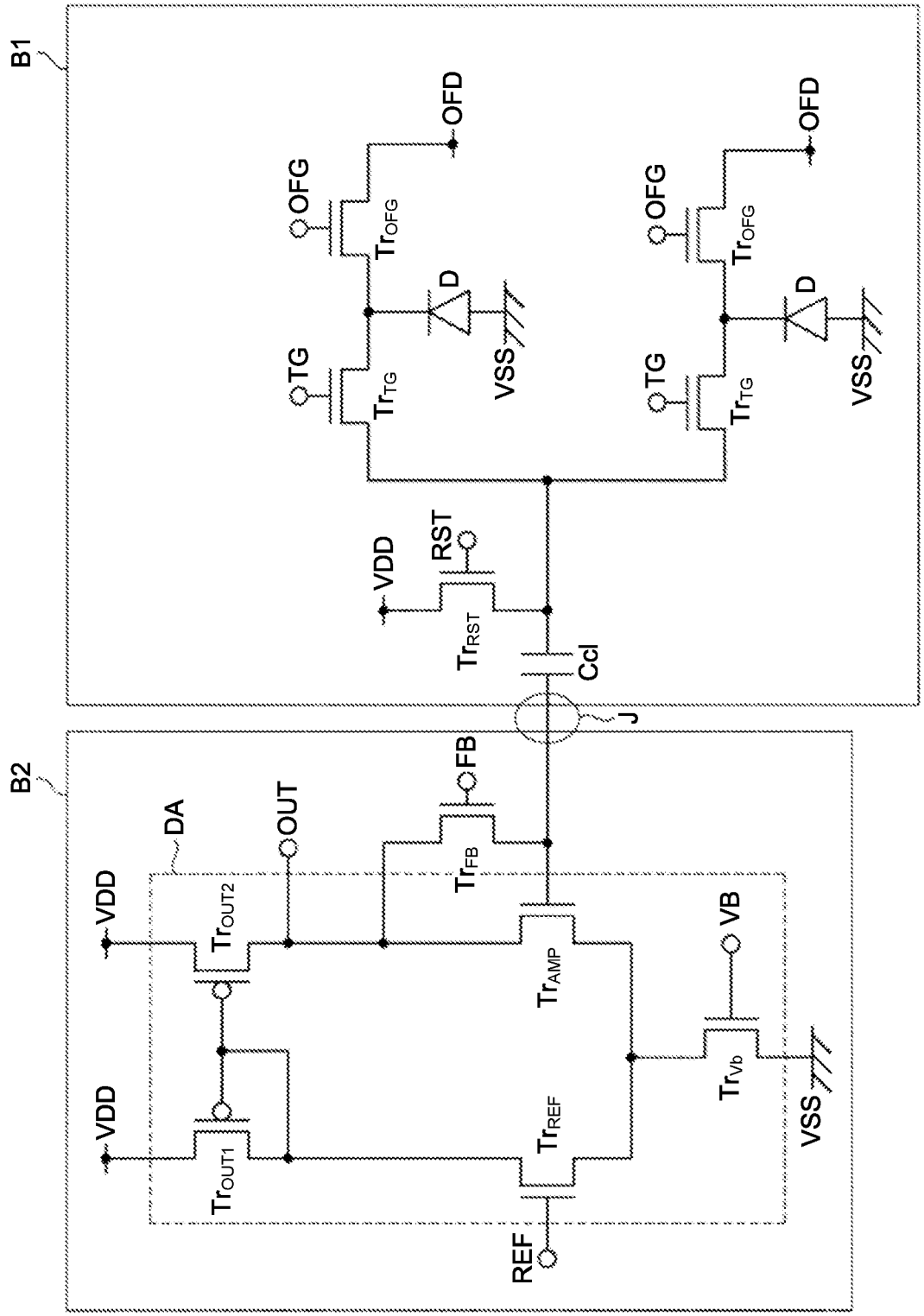
FIG. 9 is an illustrative diagram of another example of the configuration of the pixel according to the second embodiment.

FIG. 9 is an illustrative diagram of another example of the configuration of the pixel P according to the second embodiment and illustrates an exemplary configuration of "a case in which two pixels P share the floating diffusion layer Cfd, the differential amplifier circuit DA, the feedback transistor $Tr_{FB}$, the clamp capacitance Ccl, and the reset transistor $Tr_{RST}$".

When the imaging unit according to the second embodiment has the pixel P of the configuration illustrated in FIG. 9, the conductive states of the transfer transistors $Tr_{TG}$ of the respective pixels P sharing the floating diffusion layer Cfd and the like are controlled like the case in which the imaging unit has the pixel P of the configuration illustrated in FIG. 4, whereby the electric charges corresponding to the conversion of the incident light by the conversion elements D of the respective pixels P are each transferred to the floating diffusion layer Cfd.

Although FIG. 9 illustrates an example in which two pixels P share the floating diffusion layer Cfd and the like, three or more pixels P may share the floating diffusion layer Cfd and the like in the imaging unit according to the second embodiment like the imaging unit 102 according to the first embodiment.

[3-2] Layout of Pixel P According to Second Embodiment

The following describes an exemplary layout of the pixel P according to the second embodiment.

FIG. 10 is an illustrative diagram of a layout of the pixel P according to the second embodiment and illustrates an exemplary layout when the pixel P has the configuration illustrated in FIG. 9. B illustrated in FIG. 10 is a schematic diagram of the I-I line section illustrated in A illustrated in FIG. 10.

It is understood that the layout of the pixel P according to the second embodiment is not limited to the example illustrated in FIG. 10.

A pixel array of the imaging apparatus according to the second embodiment has a configuration in which the pixels P having the layout illustrated in FIG. 10 are arranged in a matrix manner like FIG. 6, for example.

[4] Imaging Apparatus According to Third Embodiment

The following describes an imaging apparatus according to a third embodiment. The imaging apparatus according to the third embodiment has a configuration (including modifications) basically similar to the imaging apparatus according to the first embodiment described above, in which the configuration of the pixel P is different from that of the pixel P of the imaging apparatus according to the first embodiment described above and that of the pixel P of the imaging apparatus according to the second embodiment described above. Given these circumstances, the following omits descriptions of points similar to those of the imaging apparatus according to the first embodiment described above and the imaging apparatus according to the second embodiment described above in the imaging apparatus according to the third embodiment and describes an exemplary configuration of the pixel P according to the third embodiment.

[4-1] Exemplary Configuration of Pixel P According to Third Embodiment

Figure 11:
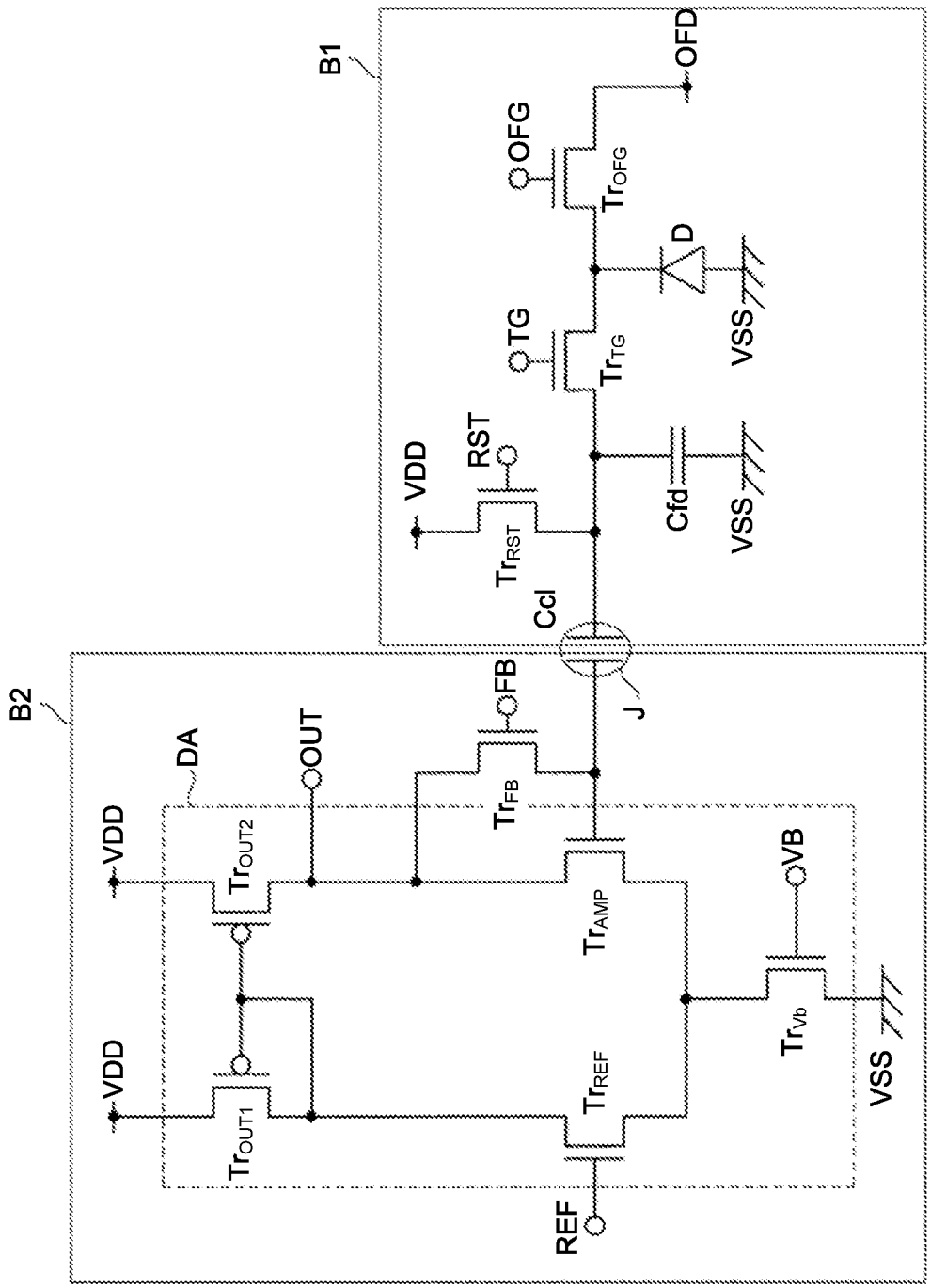
FIG. 11 is an illustrative diagram of an exemplary configuration of the pixel according to a third embodiment.

FIG. 11 is an illustrative diagram of an exemplary configuration of the pixel P according to the third embodiment. FIG. 11 illustrates an example in which the pixel P includes two boards including the first board B1 and the second board B2.

The pixel P according to the third embodiment includes the conversion element D, the floating diffusion layer Cfd, the differential amplifier circuit DA, the feedback transistor $Tr_{FB}$, the clamp capacitance Ccl, and the reset transistor $Tr_{RST}$, for example.

A difference between the pixel P according to the third embodiment and the pixel P according to the first embodiment and the pixel P according to the second embodiment is a component provided in each of the first board B1 and the second board B2.

More specifically, as illustrated in FIG. 11, in the pixel P according to the third embodiment, the conversion element D, the floating diffusion layer Cfd, and the reset transistor $Tr_{RST}$ are provided on the first board B1 as the same board. As illustrated in FIG. 11, in the pixel P according to the third embodiment, the differential amplifier circuit DA and the feedback transistor $Tr_{FB}$ are provided on the second board B2 like the pixel P according to the second embodiment. As illustrated in FIG. 11, in the pixel P according to the third embodiment, the clamp capacitance Ccl is an inter-wire capacitance formed of a joining metallic wire joining the board B1 and the board B2 together (an exemplary inter-wire capacitance of a wire joining different boards together). Examples of the joining metallic wire include metal for connecting pad.

Consequently, the pixel P according to the third embodiment has one inter-board junction J between the first board B1 and the second board B2 like the pixel P according to the second embodiment and can thus reduce the number of the inter-board junctions J compared with the first embodiment.

The pixel P according to the third embodiment can have a large Si area in which the differential amplifier circuit DA is provided like the pixel P according to the second embodiment and can thus improve the analog circuit characteristics of the differential amplifier circuit DA.

The pixel P according to the third embodiment can form a capacitance using metal for connecting pad and can perform inter-board junction with an insulating film alone, for example, and can thus improve connection yield.

The configuration of the pixel P according to the third embodiment is not limited to the example illustrated in FIG. 11.

Like the first embodiment, a plurality of pixels P may share the floating diffusion layer Cfd, the differential amplifier circuit DA, the feedback transistor $Tr_{FB}$, the clamp capacitance Ccl, and the reset transistor $Tr_{RST}$, for example.

Figure 12:
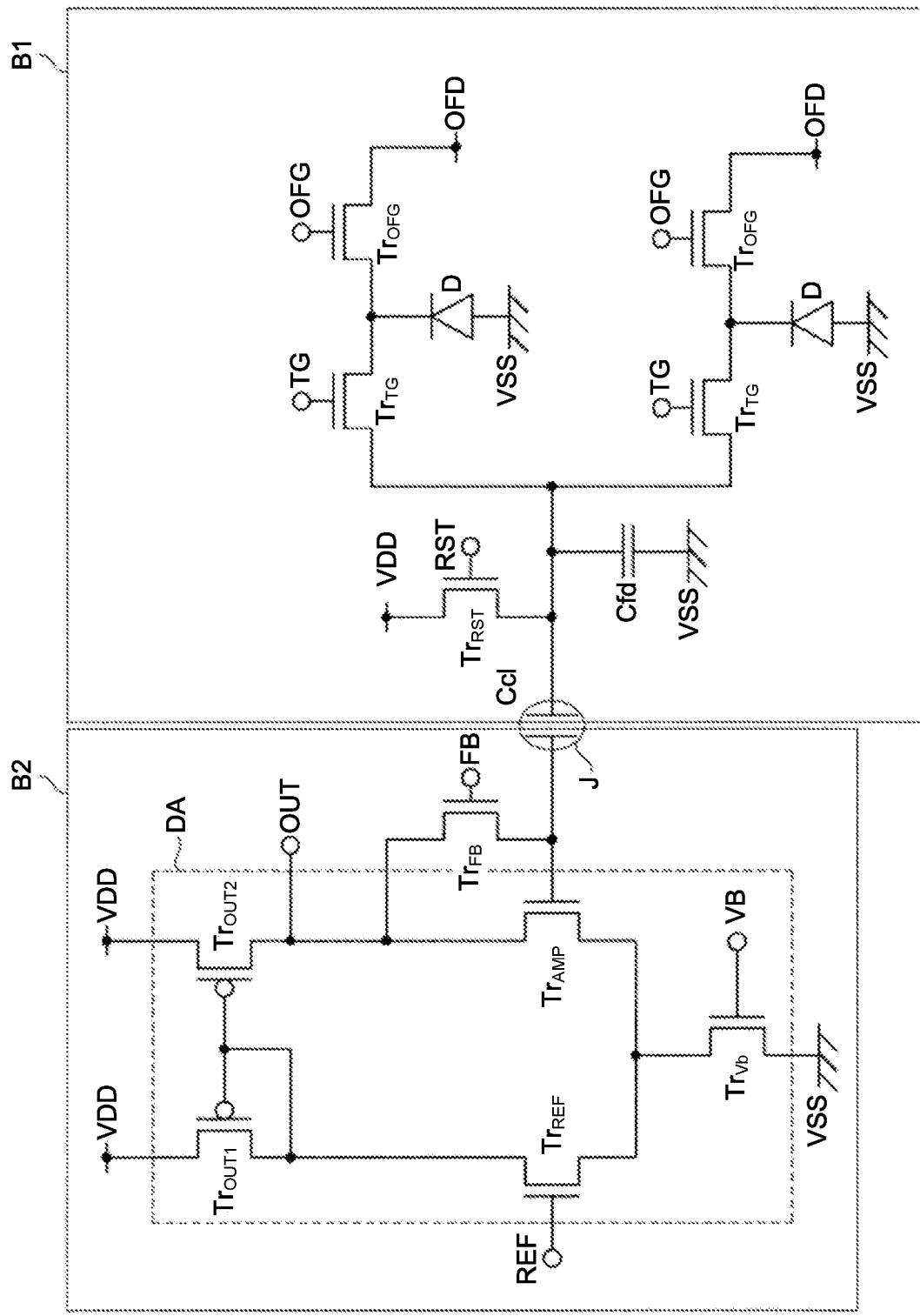
FIG. 12 is an illustrative diagram of another example of the configuration of the pixel according to the third embodiment.

FIG. 12 is an illustrative diagram of another example of the configuration of the pixel P according to the third embodiment and illustrates an exemplary configuration of "a case in which two pixels P share the floating diffusion layer Cfd, the differential amplifier circuit DA, the feedback transistor $Tr_{FB}$, the clamp capacitance Ccl, and the reset transistor $Tr_{RST}$".

When the imaging unit according to the third embodiment has the pixel P of the configuration illustrated in FIG. 12, the conductive states of the transfer transistors $Tr_{TG}$ of the respective pixels P sharing the floating diffusion layer Cfd and the like are controlled like the case in which the imaging unit has the pixel P of the configuration illustrated in FIG. 4, whereby the electric charges corresponding to the conversion of the incident light by the conversion elements D of the respective pixels P are each transferred to the floating diffusion layer Cfd.

Although FIG. 12 illustrates an example in which two pixels P share the floating diffusion layer Cfd and the like, three or more pixels P may share the floating diffusion layer Cfd and the like in the imaging unit according to the third embodiment like the imaging unit 102 according to the first embodiment.

[4-2] Layout of Pixel P According to Third Embodiment

The following describes an exemplary layout of the pixel P according to the third embodiment.

FIG. 13 is an illustrative diagram of a layout of the pixel P according to the third embodiment and illustrates an exemplary layout when the pixel P has the configuration illustrated in FIG. 12. B illustrated in FIG. 13 is a schematic diagram of the I-I line section illustrated in A illustrated in FIG. 13.

It is understood that the layout of the pixel P according to the third embodiment is not limited to the example illustrated in FIG. 13.

A pixel array of the imaging apparatus according to the third embodiment has a configuration in which the pixels P having the layout illustrated in FIG. 13 are arranged in a matrix manner like FIG. 6, for example.

[5] Imaging Apparatus According to Another Embodiment

The imaging apparatus according to the present embodiment is not limited to the imaging apparatuses according to the first embodiment, the second embodiment, and the third embodiment described above.

The imaging apparatus according to the present embodiment may further be provided with an electric shield at "a boundary part between the pixel P sharing one floating diffusion layer Cfd and the pixel P sharing another floating diffusion layer Cfd adjacent to the one floating diffusion layer Cfd" in order to reduce signal interference between the floating diffusion layers Cfd in the pixel array, for example. The electric shield is provided by a wire layer, for example.

Figure 14:
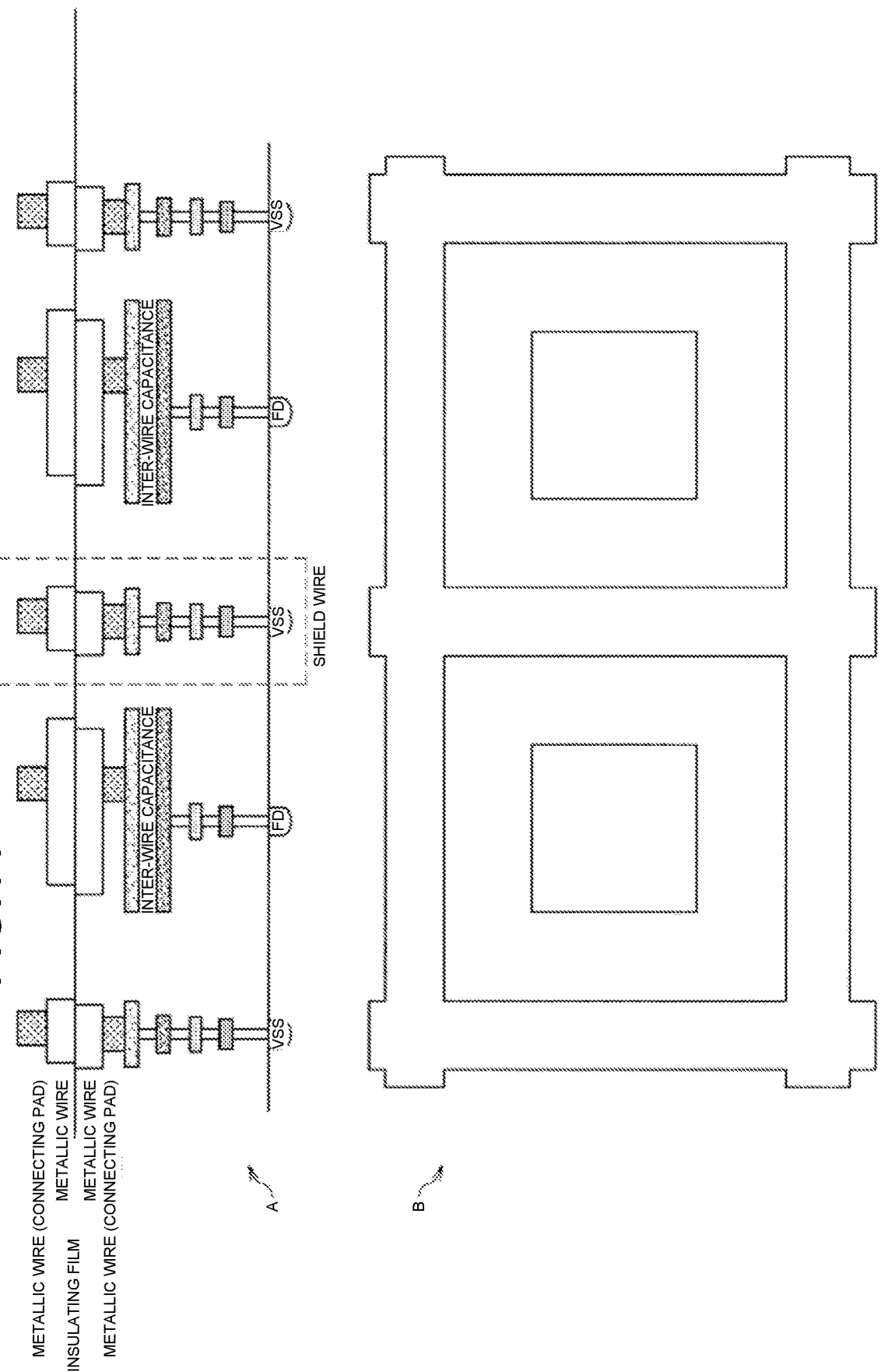
FIG. 14 is an illustrative diagram of an exemplary layout of a pixel array of an imaging apparatus according to another embodiment.

FIG. 14 is an illustrative diagram of an exemplary layout of a pixel array of an imaging apparatus according to another embodiment and illustrates an example in which the clamp capacitance Ccl is formed using wires within the boards.

As illustrated in A in FIG. 14, an electric shield is provided by a wire layer at "the boundary part between the pixel P sharing one floating diffusion layer Cfd and the pixel P sharing another floating diffusion layer Cfd adjacent to the one floating diffusion layer Cfd".

The wire included in the electric shield (hereinafter, denoted as "a shield wire") is arranged so as to surround the entire boundary part of the pixel or to surround part of the boundary part, for example. B in FIG. 14 illustrates an exemplary layout of the shield wire according to the present embodiment. It is understood that the layout of the shield wire is not limited to the example illustrated in B in FIG. 14.

The wire layer included in the electric shield (hereinafter, denoted as "a shield wire layer") includes the same metallic wire layer as each metallic wire layer included in the wire of the board including the floating diffusion layer Cfd, for example. The shield wire layer is connected to a terminal supplying a standard potential VSS.

Although FIG. 14 illustrates an example in which the clamp capacitance Ccl (the inter-wire capacitance illustrated in FIG. 14) is formed using the third wire and the fourth wire from the bottom in FIG. 14, the shield wire can be provided like FIG. 14 also in a case in which the clamp capacitance Ccl is formed using other wires.

Figure 15:
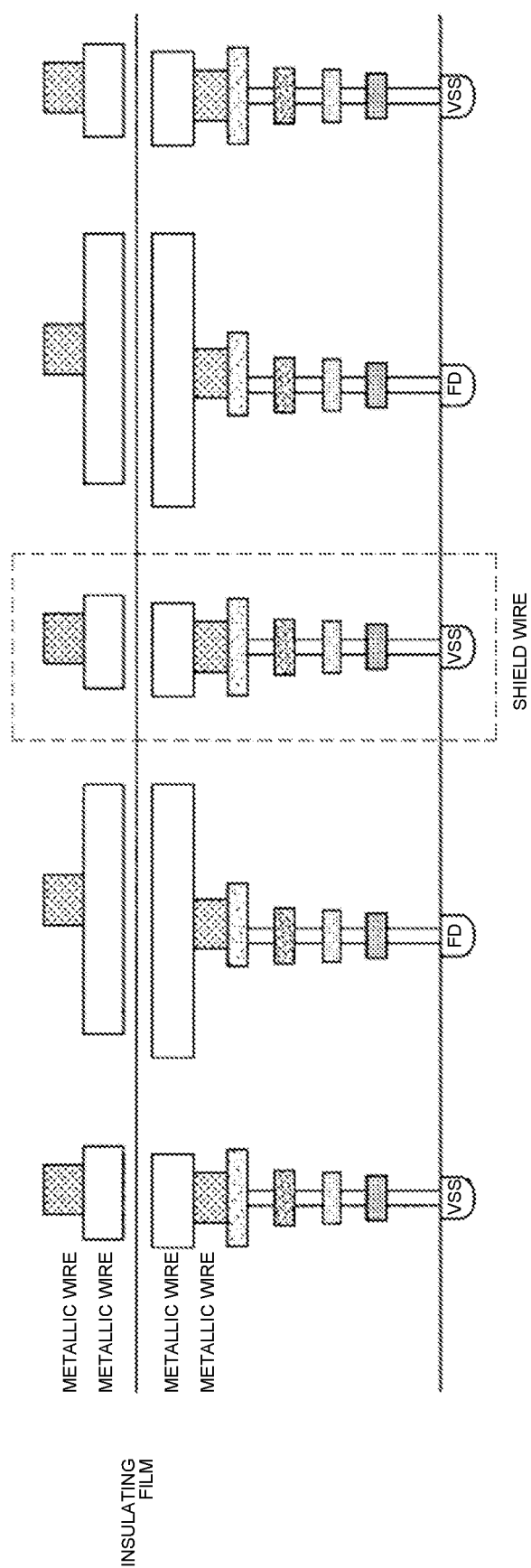
FIG. 15 is an illustrative diagram of another example of the layout of the pixel array of the imaging apparatus according to the other embodiment.

FIG. 15 is an illustrative diagram of another example of the layout of the pixel array of the imaging apparatus of the other embodiment and illustrates an example in which the clamp capacitance Ccl is formed using the uppermost wires of the respective boards.

The example illustrated in FIG. 15 is an example in which the clamp capacitance Ccl is formed with the uppermost pad layer viewed from the bottom in FIG. 15. A difference between the example illustrated in FIG. 15 and the example illustrated in FIG. 14 is the position at which the clamp capacitance Ccl is formed, and the example illustrated in FIG. 15 and the example illustrated in FIG. 14 are the same except for the difference.

As illustrated in FIG. 14 and FIG. 15, in the imaging apparatus according to the other embodiment, the electric shield by the shield wire is provided, whereby the signal interference between the floating diffusion layers Cfd in the pixel array is reduced, for example.

[6] Effects Produced by Imaging Apparatus According to Present Embodiment

The imaging apparatus according to the present embodiment produces effects described below, for example. It is understood that the effects produced by the imaging apparatus according to the present embodiment are not limited to the examples described below.

When the potential of the floating diffusion layer Cfd is initialized, the reset potential of the floating diffusion layer Cfd can be a VDD potential, and thus a reduction in the dynamic range of the floating diffusion layer Cfd caused by a voltage drop occurring in the transistor $Tr_{out2}$ included in the output stage of the differential amplifier circuit DA does not occur. When various signals such as a P phase signal and a D (data) phase signal are detected (when the voltage signal obtained by the floating diffusion layer Cfd is detected), the feedback transistor $Tr_{FB}$ is in the off state, the capacitance of the floating diffusion layer Cfd similar to the capacitance of a floating diffusion layer according to an existing technique is enough, for example, and thus a reduction in conversion efficiency in the floating diffusion layer Cfd is reduced.

As in the imaging apparatus according to the second embodiment or the imaging apparatus according to the third embodiment, the differential amplifier circuit DA is provided on a board different from the board on which the conversion element D and the like are provided, whereby the circuit characteristics of the differential amplifier circuit DA are improved. The differential amplifier circuit DA is provided on the board different from the board on which the conversion element D and the like are provided, whereby the number of the inter-board junction J can further be reduced.

(Application Examples of Imaging Apparatus According to Present Embodiment)

The imaging apparatus has been described as the present embodiment; the present embodiment is not limited to the mode. The present embodiment can be applied to various image sensors such as "image sensors used in any mobile objects such as vehicles, electric vehicles, hybrid electric vehicles, motorcycles, bicycles, personal mobilities, aircraft, drones, ships, robots, artificial satellites, and survey instruments", "industrial image sensors used in plants, distribution systems, and the like", "image sensors used in intelligent transport systems (ITSs)", and "crime-prevention image sensors", for example. The present embodiment can be applied to any apparatuses including image sensors such as the mobile objects including image sensors, for example.

The following describes an example when the technique according to the present disclosure is applied to a mobile object.

Figure 16:
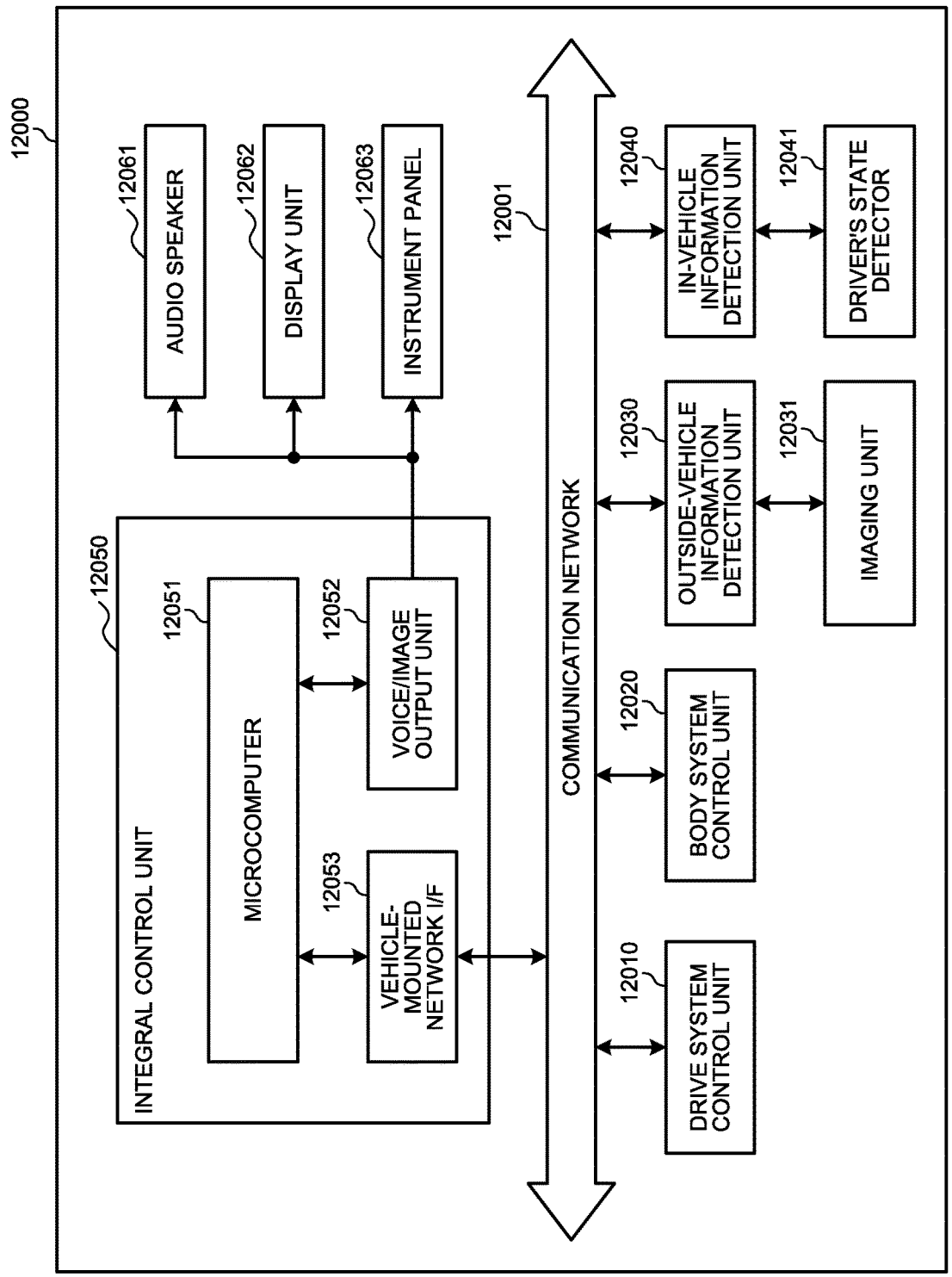
FIG. 16 is a block diagram of an exemplary schematic configuration of a vehicle control system.

FIG. 16 is a block diagram of a schematic configuration example of a vehicle control system as an exemplary mobile object control system to which the technique according to the present disclosure can be applied.

This vehicle control system 12000 includes a plurality of electronic control units connected to each other via a communication network 12001. In the example illustrated in FIG. 16, the vehicle control system 12000 includes a drive system control unit 12010, a body system control unit 12020, an outside-vehicle information detection unit 12030, an in-vehicle information detection unit 12040, and an integral control unit 12050. Illustrated as functional components of the integral control unit 12050 are a microcomputer 12051, a voice/image output unit 12052, and a vehicle-mounted network interface (I/F) 12053.

The drive system control unit 12010 controls operations of apparatuses related to a drive system of a vehicle in accordance with various kinds of computer programs. The drive system control unit 12010 functions as a control apparatus of a driving force generation apparatus for generating a driving force of the vehicle such as an internal combustion engine or a drive motor, a driving force transmission mechanism for transmitting the driving force to wheels, a steering mechanism adjusting a steering angle of the vehicle, a braking apparatus for generating a braking force of the vehicle, or the like, for example.

The body system control unit 12020 controls operations of various kinds of apparatuses installed in a vehicle body in accordance with various kinds of computer programs. The body system control unit 12020 functions as a control apparatus of a keyless entry system, a smart key system, power windows, or various kinds of lights such as headlights, rear lights, breaking lights, blinkers, and fog lights, for example. In this case, radio waves transmitted from a portable device replacing a key or signals of various kinds of switches can be input to the body system control unit 12020. Upon reception of input of these radio waves or signals, the body system control unit 12020 controls door locks, power windows, lights, and the like of the vehicle.

The outside-vehicle information detection unit 12030 detects information outside a vehicle having the vehicle control system 12000 installed. An imaging unit 12031 is connected to the outside-vehicle information detection unit 12030, for example. The outside-vehicle information detection unit 12030 causes the imaging unit 12031 to take images outside the vehicle and receives the taken images. The outside-vehicle information detection unit 12030 may perform object detection processing for humans, vehicles, obstacles, signs, letters on roads, or the like or distance detection processing based on the received images.

The imaging unit 12031 is a light sensor receiving light and outputting an electric signal corresponding to the amount of reception of the light. The imaging unit 12031 can output the electric signal as an image and can also output it as distance-measuring information. The light received by the imaging unit 12031 may be visible light or nonvisible light such as infrared rays.

The in-vehicle information detection unit 12040 detects in-vehicle information. A driver's state detector 12041 detecting the state of a driver is connected to the in-vehicle information detection unit 12040, for example. The driver's state detector 12041 includes a camera for taking images of the driver, for example; the in-vehicle information detection unit 12040 may calculate the degree of fatigue or the degree of concentration of the driver or determine whether the driver is not falling asleep based on detection information input from the driver's state detector 12041.

The microcomputer 12051 can compute a control target value of the driving force generation apparatus, the steering mechanism, or the braking apparatus based on the in- or outside-vehicle information acquired by the outside-vehicle information detection unit 12030 or the in-vehicle information detection unit 12040 and output control commands to the drive system control unit 12010. The microcomputer 12051 can perform cooperative control aiming at achieving the function of an advanced driver assistance system (ADAS) including vehicle collision avoidance or shock absorption, vehicle distance-based following travel, vehicle speed maintaining travel, vehicle collision warning, and vehicle lane deviation warning, for example.

The microcomputer 12051 controls the driving force generation apparatus, the steering mechanism, or the braking apparatus based on information around the vehicle acquired by the outside-vehicle information detection unit 12030 or the in-vehicle information detection unit 12040 and can thereby perform cooperative control aiming at autonomous driving autonomously traveling without involving driver's operations and the like.

The microcomputer 12051 can output control commands to the body system control unit 12020 based on the outside-vehicle information acquired by the outside-vehicle information detection unit 12030. The microcomputer 12051 can perform cooperative control aiming at antiglare including controlling the headlights in accordance with the position of a preceding vehicle or a vehicle in the opposite lane detected by the outside-vehicle information detection unit 12030 and switching a high beam to a low beam, for example.

The voice/image output unit 12052 transmits an output signal, which is at least either a voice or an image, to output apparatuses capable of providing visual or auditory information to passengers of the vehicle or to the outside of the vehicle. The example in FIG. 16 exemplifies an audio speaker 12061, a display unit 12062, and an instrument panel 12063 as the output apparatuses. The display unit 12062 may include at least one of an onboard display and a head-up display, for example.

Figure 17:
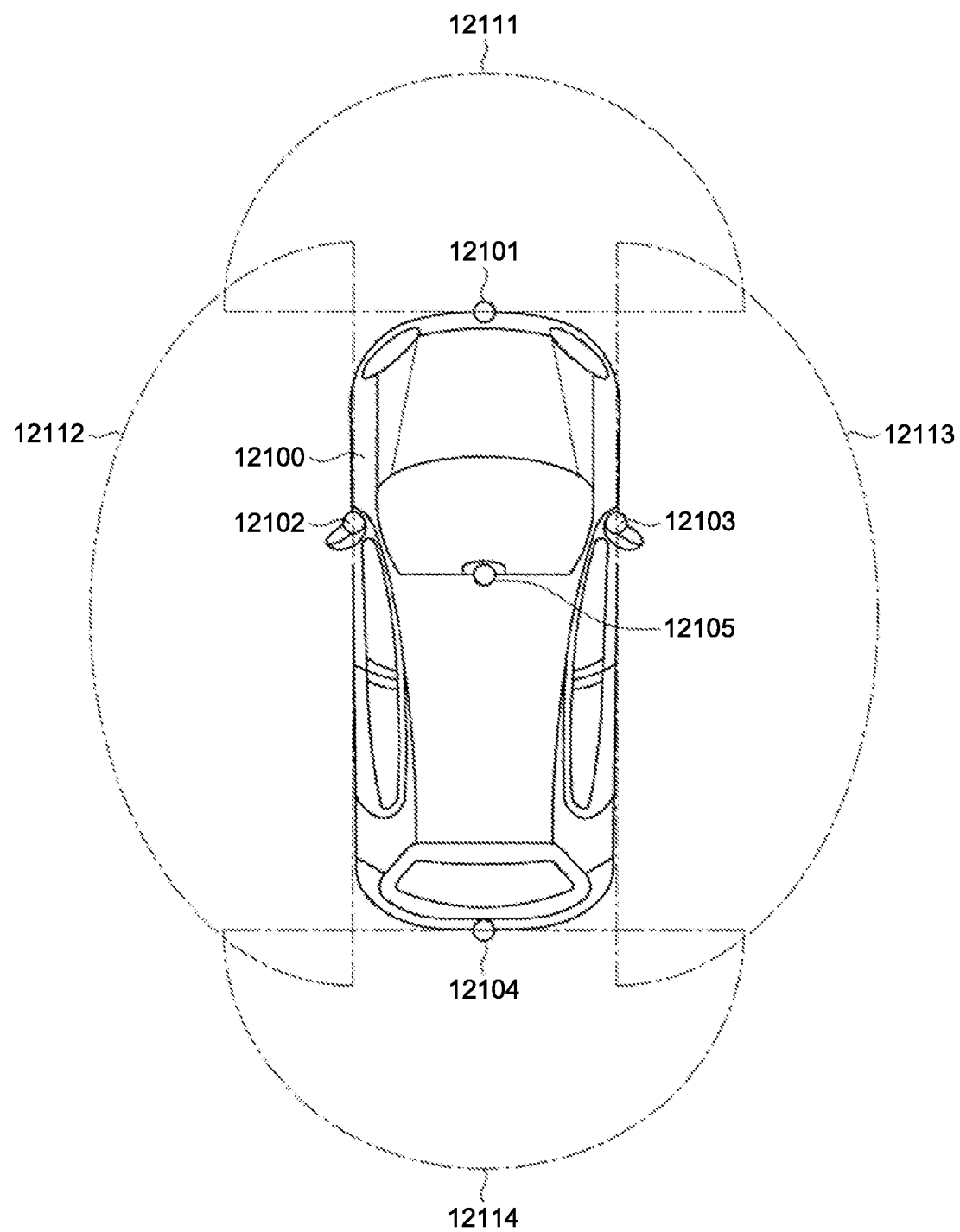
FIG. 17 is an illustrative diagram of exemplary installation positions of an outside-vehicle information detector and imaging units.

FIG. 17 is a diagram of exemplary installation positions of the imaging unit 12031.

In FIG. 17, a vehicle 12100 has imaging units 12101, 12102, 12103, 12104, and 12105 as the imaging unit 12031.

The imaging units 12101, 12102, 12103, 12104, and 12105 are provided at positions such as a front nose, side mirrors, a rear bumper, a rear door, and an upper part of a windshield within a cabin of the vehicle 12100, for example. The imaging unit 12101 provided at the front nose and the imaging unit 12105 provided at the upper part of the windshield within the cabin mainly acquire images in front of the vehicle 12100. The imaging units 12102 and 12103 provided at the side mirrors mainly acquire images at the sides of the vehicle 12100. The imaging unit 12104 provided at the rear bumper or the rear door mainly acquires images behind the vehicle 12100. The forward images acquired by the imaging units 12101 and 12105 are mainly used for detection of preceding vehicles or pedestrians, obstacles, traffic signals, traffic signs, traffic lanes, or the like.

FIG. 17 illustrates exemplary imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103, respectively, provided at respective side mirrors, and an imaging range 12114 indicates an imaging range of the imaging unit 12104 provided at the rear bumper or the rear door. Pieces of image data taken by the imaging units 12101 to 12104 are superimposed, whereby a bird's-eye image viewing the vehicle 12100 from above is obtained, for example.

At least one of the imaging units 12101 to 12104 may have a function of acquiring distance information. At least one of the imaging units 12101 to 12104 may be a stereo camera including a plurality of imaging elements or an imaging element having pixels for phase difference detection, for example.

The microcomputer 12051 determines a distance to each solid object within the imaging ranges 12111 to 12114 and a temporal change of this distance (a relative speed to the vehicle 12100) based on the distance information obtained from the imaging units 12101 to 12104 and can thereby in particular extract a closest solid object on a traveling road of the vehicle 12100, the solid object traveling at a certain speed (e.g., 0 km/h or more) in substantially the same direction as the vehicle 12100 as a preceding vehicle, for example. Furthermore, the microcomputer 12051 can set a following distance to be ensured in advance before the preceding vehicle to perform automatic braking control (including following abort control), automatic acceleration control (including following start control), or the like. Thus, cooperative control aiming at autonomous driving autonomously traveling without involving driver's operations and the like can be performed.

The microcomputer 12051 can extract pieces of solid object data on solid objects while classifying them into a motorcycle, a normal vehicle, a large vehicle, a pedestrian, and other solid objects such as a utility pole based on the distance information obtained from the imaging units 12101 to 12104 and use them for automatic obstacle avoidance, for example. The microcomputer 12051 discriminates obstacles around the vehicle 12100 between obstacles visually recognizable by the driver of the vehicle 12100 and obstacles difficult to be visually recognized, for example. The microcomputer 12051 determines collision risk indicating the degree of risk of a collision with each obstacle and, in a situation in which the collision risk is a set value or more and there is a possibility of a collision, outputs a warning to the driver via the audio speaker 12061 or the display unit 12062 or performs forced braking or avoidance steering via the drive system control unit 12010, and can thereby perform driving assistance for collision avoidance.

At least one of the imaging units 12101 to 12104 may be an infrared camera detecting infrared rays. The microcomputer 12051 determines whether there are any pedestrians in taken images of the imaging units 12101 to 12104 and can thereby recognize pedestrians, for example. Such recognition of pedestrians is performed by a step of extracting characteristic points in the taken images of the imaging units 12101 to 12104 as infrared cameras and a step of performing pattern matching processing on a series of characteristic points indicating the contour of an object to determine whether the object is a pedestrian, for example. When the microcomputer 12051 determines that there are any pedestrians in the taken images of the imaging units 12101 to 12104 to recognize a pedestrian, the voice/image output unit 12052 controls the display unit 12062 to display a rectangular contour for enhancement in a superimposed manner on the recognized pedestrian. The voice/image output unit 12052 may control the display unit 12062 to display an icon or the like indicating the pedestrian at a desired position.

An exemplary vehicle control system when the technique according to the present embodiment is applied to a mobile object has been described. The technique according to the present embodiment can be applied to the imaging unit 12031 in the vehicle control system, for example. It is understood that the component to which the technique according to the present embodiment is applied is not limited to the imaging unit 12031 in the vehicle control system.

The preferred embodiments of the present disclosure have been described with reference to the accompanying drawings; the technical scope of the present disclosure is not limited to such examples. It is obvious that those having normal knowledge in the technical field of the present disclosure can think of various kinds of modified examples or corrected examples within the scope of the technical thought described in the claims, and it is understood that they also naturally belong to the technical scope of the present disclosure.

The effects described in the present specification are only illustrative and exemplary and are not limiting. In other words, the technique according to the present disclosure can produce other effects obvious to those skilled in the art from the descriptions of the present specification together with the above effects or in place of the above effects.

The following configurations also belong to the technical scope of the present disclosure.

(1)

An imaging apparatus comprising an imaging unit having a plurality of pixels, the pixels each having:

a conversion element converting incident light into photoelectrons;

a floating diffusion layer electrically connected to the conversion element and converting the photoelectrons into a voltage signal;

a differential amplifier circuit electrically connected to the floating diffusion layer, including an amplifier transistor to which a potential of the floating diffusion layer is input, and amplifying the potential of the floating diffusion layer;

a feedback transistor electrically connected to the amplifier transistor and initializing the differential amplifier circuit;

a clamp capacitance connected in series between the floating diffusion layer and the amplifier transistor; and a reset transistor connected in parallel between the floating diffusion layer and the clamp capacitance and initializing the potential of the floating diffusion layer.

(2)

The imaging apparatus according to (1), wherein the pixels share the floating diffusion layer, the differential amplifier circuit, the feedback transistor, the clamp capacitance, and the reset transistor.

(3)

The imaging apparatus according to (1) or (2), wherein the imaging unit includes a plurality of laminated boards, and at least the conversion element, the floating diffusion layer, and the reset transistor are provided on the same board.

(4)

The imaging apparatus according to (3), wherein the conversion element, the floating diffusion layer, part of the differential amplifier circuit including the amplifier transistor, the feedback transistor, the clamp capacitance, and the reset transistor are provided on the same board.

(5)

The imaging apparatus according to (3), wherein the conversion element, the floating diffusion layer, the clamp capacitance, and the reset transistor are provided on the same board.

(6)

The imaging apparatus according to (3), wherein
the conversion element, the floating diffusion layer, and the reset transistor are provided on the same board, and the clamp capacitance is an inter-wire capacitance of a wire joining different boards together.

(7)

The imaging apparatus according to any one of (1) to (6), wherein when the potential of the floating diffusion layer is initialized, the feedback transistor is in an on state, and a terminal of the amplifier transistor electrically connected to the floating diffusion layer is fixed to an initialized potential of the differential amplifier circuit, and when the voltage signal obtained by the floating diffusion layer is detected, the feedback transistor is in an off state, and the terminal of the amplifier transistor is electrically floated.

REFERENCE SIGNS LIST

100 Imaging apparatus
102 Imaging unit
104 Driver
Cfd Floating diffusion layer
Ccl Clamp capacitance
D Conversion element
DA Differential amplifier circuit
P Pixel
Tr$_{AMP}$ Amplifier transistor
Tr$_{FB}$ Feedback transistor
Tr$_{RST}$ Reset transistor

The invention claimed is:

1. A light detecting device, comprising:
a first substrate including:
a plurality of pixels including a first pixel that includes a first conversion element, and
a first part of a differential amplifier circuit coupled to the first conversion element via a transfer transistor, a floating diffusion and a capacitor; and
a second substrate laminated to the first substrate, the second substrate including:
a second part of the differential amplifier circuit coupled to the first part of the differential amplifier circuit;
wherein the first part of the differential amplifier circuit and the second part of the differential amplifier circuit are electrically connected by a metal bonding,
the capacitor is coupled in series between the floating diffusion and a first input of the differential amplifier circuit, and
a feedback transistor is coupled to the first input of the first part of the differential amplifier circuit and configured to initialize the differential amplifier circuit.

2. The light detecting device according to claim 1, wherein the first substrate and the second substrate are electrically connected by a connecting pad.

3. The light detecting device according to claim 2, wherein the first conversion element and a second conversion element of a second pixel of the plurality of pixels share the floating diffusion.

4. The light detecting device according to claim 3, wherein the first part of the differential input circuit includes the first input and a second input, and the second input receives a reference signal.

5. The light detecting device according to claim 1, further comprising:
a reset transistor connected in parallel between the floating diffusion and the capacitor and configured to initialize a potential of the floating diffusion.

6. The light detecting device according to claim 5, wherein the first pixel and a second pixel of the plurality of pixels share the floating diffusion, the differential amplifier circuit, the feedback transistor, the capacitor, and the reset transistor.

7. The light detecting device according to claim 5, wherein the feedback transistor is located on the second substrate, and the reset transistor is located on the first substrate.

8. The light detecting device according to claim 7, wherein the capacitor is located on the first substrate.

9. The light detecting device according to claim 1, wherein the feedback transistor is located on the second substrate.

10. The light detecting device according to claim 1, wherein
when a potential of the floating diffusion is initialized, the feedback transistor is in an on state, and a terminal of the differential amplifier circuit electrically connected to the floating diffusion is fixed to an initialized potential, and
when a voltage signal obtained by the floating diffusion is detected, the feedback transistor is in an off state, and the terminal of the differential amplifier circuit is electrically floated.

* * * * *